(12) United States Patent
Hasebe et al.

(10) Patent No.: US 7,355,270 B2
(45) Date of Patent: Apr. 8, 2008

(54) SEMICONDUCTOR CHIP WITH COIL ANTENNA AND COMMUNICATION SYSTEM

(75) Inventors: Takehiko Hasebe, Yokohama (JP); Yasushi Goto, Tokyo (JP); Kouichi Uesaka, Yokohama (JP); Yoshiaki Yazawa, Tokyo (JP); Makoto Torigoe, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 281 days.

(21) Appl. No.: 11/030,058

(22) Filed: Jan. 7, 2005

(65) Prior Publication Data

US 2005/0173532 A1    Aug. 11, 2005

(30) Foreign Application Priority Data

Feb. 10, 2004 (JP) ............................. 2004-033293

(51) Int. Cl.
  *H01L 23/02* (2006.01)
(52) U.S. Cl. .................. 257/679; 257/684; 257/728
(58) Field of Classification Search ................ 257/679, 257/684, 728
See application file for complete search history.

(56) References Cited

U.S. PATENT DOCUMENTS

| 6,268,796 | B1 | 7/2001 | Gnadinger et al. |
| 6,538,569 | B1 | 3/2003 | Dunn |
| 7,119,693 | B1 * | 10/2006 | Devilbiss ................ 340/572.5 |
| 2003/0102872 | A1 | 6/2003 | Honda |

FOREIGN PATENT DOCUMENTS

| EP | 1168442 A2 | 1/2002 |
| JP | 04-363006 | 12/1992 |
| JP | 2001-147231 | 5/2001 |
| JP | 2002-014072 | 1/2002 |
| JP | 2002-092566 | 3/2002 |
| JP | 2002-093916 | 3/2002 |
| JP | 2002092566 | 3/2002 |
| JP | 2004-213196 | 7/2004 |
| WO | WO 01/80173 A1 | 10/2001 |

OTHER PUBLICATIONS

Hassan M. Elkamchouchi et al, Helical Antennas with Nonuniform Helix Diamter, Eighteenth National Radio Science Conference, pp. 143-152.*

IBM Technical Disclosure Bulletin, "Radiofrequency Tag With Biological Sensor," M. J. Brady et al, vol. 40, No. 02, Feb. 1997 [XP000692192], p. 115 (one page).

European Search Report for EP 05000752, dated Nov. 8, 2007.

* cited by examiner

*Primary Examiner*—Douglas M. Menz
(74) *Attorney, Agent, or Firm*—Antonelli, Terry, Stout & Kraus, LLP.

(57) ABSTRACT

The present invention intends to prevent the communication distance from becoming shorter with a reduction in size of a coil antenna to the chip size and with a consequent decrease of an induced voltage. According to the present invention there is provided a semiconductor chip having a coil antenna and a circuit surface and adapted to transmit and receive signals by radio to and from an external device. The semiconductor chip has a configuration for increasing an electromagnetic coupling coefficient between the coil antenna and the external device. According to a concrete example thereof, a magnetic material is disposed, the coil antenna is formed by a stacked structure comprising plural conductor layers and insulating layers superimposed one on another, or the coil antenna is disposed outside an external form of a circuit of the semiconductor chip.

6 Claims, 19 Drawing Sheets

SEMICONDUCTOR CHIP WITH COIL ANTENNA AND COMMUNICATION SYSTEM

CLAIM OF PRIORITY

The present application claims priority from Japanese application JP 2004-033293 filed on Feb. 10, 2004, the content of which is hereby incorporated by reference into this application.

1. Field of the Invention

The present invention relates to a semiconductor chip for transmission and reception of signals by radio to and from an external device, and more particularly, to a semiconductor chip having a configuration for increasing a coupling coefficient between a coil antenna and an external device, and a communication system using the semiconductor chip.

2. Related Art

RFID (Radio Frequency Identification) wherein a radio signal is provided from an external device (reader/writer) and information stored in memory in a tag is read, is now being noted as a basic technique for the ubiquitous society. Radio communication techniques using 13.56 MHz and 2.45 GHz defined by the radio law as resonance frequencies have been developed in Japan.

An RFID tag as a first example comprises a PET substrate of a credit card size formed with a coil antenna and a semiconductor chip. An RFID tag as a second example comprises a semiconductor chip of 0.4 mm square with ID information recorded therein and a flexible substrate formed with a rectangular antenna of, e.g., 56×2 mm. This semiconductor chip can be mounted also on paper because it is an ultra-small sized chip.

In such RFID, the reader/writer and the tag make contact-free communication with each other. That is, an electromagnetic wave radiated from a transformer of the reader/writer passes through the coil antenna, so that an electromotive force is generated in the coil antenna. The electromotive force is converted to a direct current, which drives the semiconductor chip in the tag. The semiconductor chip performs processing in accordance with a pre-programmed procedure and transmits information, including ID information, to the reader/writer. Information from the semiconductor chip is returned to the reader/writer through the coil antenna. The reader/writer is connected to a large-size processing storage unit such as a server and performs settlement of railroad tickets and information management in connection with production and distribution of farm products. A contact-free communication system is higher in security than the magnetic card and is expected to prevent forgery of negotiable securities. Further, its data capacity is much larger than that of the magnetic card or bar code and is difficult to be influenced by stains or obstacles.

Standardization has been also proceeding. When a plurality of tags are present in an alternate magnetic field from the reader/writer, if the tags respond at random to a request command issued from the reader, signals will be superimposed on one another and the reader cannot receive data accurately. Therefore, in ISO 15693 at the resonance frequency of 13.56 MHz, ID of a tag is recognized by collision prevention processing and the procedure (anti-collision procedure) for activating the selected tag is defined.

A conventional technique wherein the size of a coil antenna is reduced to about the chip size of RFID is disclosed in Japanese Patent Laid-open No. 2002-14072. A semiconductor chip having a sensor such as an ion sensitive FET and a communication function component such as a coil antenna, as well as a measuring system using the semiconductor chip, are provided in Patent Literature 1. The semiconductor chip comprises a sensor for detecting a change in quantity or concentration of a substance, a controller for processing the result of the detection, and an antenna which not only transmits a signal to the exterior but also receives energy necessary for the signal transmitting operation and for operation of the sensor and the controller. These components are formed as a single integrated circuit element.

Thus, RFID has characteristics far superior to that of the conventional ID system and is a very highly expected technique.

Miniaturization of an RFID tag is indispensable to incorporate it in any material including paper. For semiconductor chips, because of a remarkable improvement of the integration degree, the size of functional components necessary for RFID, including a memory and an RF circuit, is becoming smaller and smaller. In addition, a system-on-chip with even a control unit incorporated in a single chip has been developed. It is presumed that the semiconductor chip for RFID will become smaller in size and larger in the number of functions also in future.

On the other hand, the supply of electric power and the transmission of commands, which are necessary for driving the semiconductor chip, as well as a reply from the semiconductor chip to the reader/writer, are performed by what is called electromagnetic coupling type communication. This communication, which is schematically shown in FIG. 1, will be described below. FIG. 1 is a schematic diagram explanatory of electromagnetic coupling. Reference numeral 51 denotes a coil antenna having a magnetic permeability of $\mu r$ and with a loop of a loop area of Stag located at a lower position. A transformer 54 for transmission and reception of signals to and from the antenna is disposed in opposition to the antenna. Reference numeral 52 denotes a voltmeter, 53 denotes an alternate source, and 203 denotes an alternate magnetic field (magnetic field lines).

When an alternate current Irw of a resonance frequency provided from a power supply is passed through a transformer of inductance Lrw provided in the reader/writer, a magnetic flux $\Phi rw$ is generated. At this time, $\Phi tag$, which is part of the magnetic flux $\Phi rw$, passes through the coil antenna in the tag of inductance Ltag, whereby an electromotive force Vtag is generated. The Vtag and $\Phi tag$ can be represented by the following Eqs. 1 and 2, respectively.

$$V_{tag} = -\partial \Phi_{tag}/\partial t \quad \text{(Eq. 1)}$$

$$\Phi_{tag} = B_{tag} S_{tag} = \mu_0 \mu_r H_{tag} S_{tag} \quad \text{(Eq. 2)}$$

The above Eqs. 1 and show that when a magnetic flux density Btag which has been improved with a magnetic material high in magnetic permeability passes through a large loop area Stag of the tag, a high electromotive force Vtag can be obtained.

An explanation can be made also from the following Eqs. 3 and 4, using a coupling coefficient k which is based on the distance between the coil antenna and the transformer and those structure.

$$V_{tag} = MdI_{rw}/dt = k\sqrt{L_{tag} \cdot L_{rw}} \, dI_{rw}/dt \quad \text{(Eq. 3)}$$

$$L_{tag} = \mu_0 \mu_r n^2 S_{tag}/I_{tag} \quad \text{(Eq. 4)}$$

In Eq. 3, M stands for a mutual inductance. In a small-sized coil antenna, the magnetic flux $\Phi tag$ passing through a small loop area Stag is small and it is difficult to obtain a larger electromotive force Vtag than that required for driving a semiconductor chip. The communication efficiency in a reply is also deteriorated.

The variables of the magnetic flux include, in addition to inductance L, a coupling coefficient k (0<k≦1) and a current value Irw. In order to obtain a larger electromotive force Vtag, a method is adopted wherein the coupling coefficient k is approximated to 1 by shortening the distance between the coil antenna and the transformer, i.e., communication distance. Alternatively, a method is adopted wherein the current value Irw is increased. However, in the former method, the working environment of RFID is greatly limited, and in the latter method, a reply from the chip is erased by a signal provided from the reader/writer and can no longer be read. According to a countermeasure so far adopted, in order to obtain a sufficient magnetic flux passing through the coil antenna, the loop area Stag is in many cases designed to be much larger than the semiconductor chip size required from the memory and RF circuit. This has been a limitation on a mounting object of RFID, i.e., a group of applied products. In a case of forming a coil antenna on a chip as in Japanese Patent Laid-open No. 2002-14072, it is presumed for the above reason that the communication distance will become very short.

Thus, it is required to provide a technique capable of affording a sufficient communication distance in an environment according to an intended application by use of a small-sized antenna, ideally, a coil antenna of the semiconductor chip size.

SUMMARY OF THE INVENTION

In one aspect of the present invention for solving the above-mentioned problem there is provided a semiconductor chip having a coil antenna of a spiral figure and a circuit surface and provided with a communication unit for transmission and reception of signals to and from an external device by radio, the semiconductor chip having a construction for increasing the coupling efficiency between the antenna coil and the external device. The following modes can be considered as main examples of the construction for increasing the coupling coefficient between the antenna coil and the external device.

(1) A magnetic material is disposed to concentrate a magnetic flux.

(2) A stacked structure of plural layers are used as the coil antenna to increase inductance L.

(3) A mirror effect of the coil antenna induced by the semiconductor chip circuit is utilized. More specifically, the circuit surface is concentrated in the central portion surrounded with the antenna coil to create a mirror effect in a catercornered shape.

(4) A mode using the above modes (1) to (3) in combination.

Typical examples of the mode in which a magnetic material is disposed to concentrate a magnetic flux include the following.

The gist of the present invention resides in a semiconductor chip comprising a coil antenna, a circuit for transmission and reception of signals to and from an external device with use of the coil antenna, and a mechanism for increasing a coupling coefficient in an electromagnetic coupling between the coil antenna and the external device. A typical shape of the coil antenna is a spiral figure.

In the first aspect of the present invention, the mechanism for increasing the coupling coefficient in the electromagnetic coupling between the coil antenna and the external device includes a magnetic material disposed on the chip surface side of the semiconductor chip.

The chip surface of the semiconductor chip on which the magnetic material is disposed may be the surface on the side on which the coil antenna of the semiconductor chip is mounted or the surface on the side opposite thereto.

The present invention is applicable to a mode wherein a sensitive material sensitive to a desired substance is disposed on the chip surface on the side where the coil antenna of the semiconductor chip is mounted.

The gist of the present invention is as below. As in Eqs. 1 and 2, the magnetic flux passing through the loop area Stag increases in proportion to the magnetic permeability μr of the magnetic material. The state of magnetic field lines in the absence of the magnetic material and that in the presence of the magnetic material are shown schematically in FIGS. 2A and 2B, respectively. In the example shown in FIG. 2A, a polymer resin layer 102 is formed on a silicon wafer 101, and a coil antenna 104 is mounted on the polymer resin layer 102. In the example of FIG. 2B, a magnetic material 130 is disposed in the interior of the coil antenna 104. In the figures, reference numeral 203 denotes an alternate magnetic field, i.e., magnetic filed lines.

Further, also Eqs. 3 and 4 shows the effect of a magnetic material relative to the electromotive force Vtag and it is seen that the use of a magnetic material high in magnetic permeability also in the transformer of the reader/writer is advantageous. An example of the magnetic material will now be shown. MN 50S (trade name) manufactured by Hitachi Metals, Ltd. is mentioned as an example of Ni—Zn ferrite material whose magnetic permeability at 10 MHz exceeds 200. Absorshield™ K-E Series of Hitachi Metal, Ltd. are mixed sheets of a nanocrystalline soft magnetic material and a resin, realizing a magnetic permeability of 8.5 at 1 GHz. Selecting a material high in magnetic permeability relative to the frequency range used in communication is effective in enlarging the electromotive force Vtag.

The larger the loop area Stag of the coil antenna in the tag and the number the number of turns, the more effective in obtaining a large electromotive force Vtag. However, in the case of a small-sized RFID tag, the coil antenna mounting area is limited to a small level. In the case of a coil antenna whose profile size is limited, both the loop area and the number of turns can be increased by improving the wiring density. Additionally, a stacked structure comprising coils wound in the same direction can afford a large self-inductance. For example, the stacked structure is constructed such that the first layer is wound clockwise while decreased in diameter from the outside to the inside and the second layer is wound counterclockwise while increased in diameter from the inside to the outside. Further, the shorter the coil length, the more effective, and it is preferable that the thickness of an interlayer insulation film be set to a small level.

In order to resonate the coil antenna relative to the alternate magnetic field provided from the transformer, it is preferable that the reactance component at a desired frequency be as close to zero as possible. In the case of a small-sized coil antenna, reactance frequently exhibits inductivity; therefore, it is usually conducted to insert a reactive reactance, i.e., a capacitor, into a resonance circuit of the antenna portion in the tag. For example, in order to provide 1 pF by a thin film capacitor that uses $SiO_2$ as a dielectric and has an inter-electrode distance of 10 nm, it is necessary from Eq. 5 to use electrodes each having an area of about $2.9 \times 10^{-10}$ $m^2$. In this size, one side is about 17 μm in the case of a square shape. It is therefore desired that the mounting area that the thin film capacitor takes in a smaller semiconductor chip be kept small. In this connection, by including a high parasitic capacitance with use of the coil antenna, it is possible to decrease the capacitance of the capacitor which is inserted for adjusting the resonance frequency, that is, decrease the capacitor mounting area. The use of a thick wiring, a short wiring interval, and the coating of wiring with a material having high relative permittivity, is effective in the above point.

In the case of a stacked structure comprising plural layers of coil antennas, it is possible to increase parasitic capacitance between the layers. In this case, as shown in FIG. 3A, if parallel components of a coil wiring having a large wiring width are stacked in the normal direction of the coil plane to afford a thin wiring interlayer insulating film of a high relative permittivity, this structure is effective in obtaining a higher parasitic capacitance.

In the example shown in FIG. 3A, a semiconductor integrated circuit is formed on a silicon wafer 101 and an upper surface thereof is indicated at 109. A first layer 1041 as a first coil antenna and a second layer as a second coil antenna are disposed through the polymer resin layer 102 formed on top of the semiconductor integrated circuit. The top portion is covered with a polymer resin film 107 for protection. A polyimide resin is suitable as the polymer resin film 107. FIG. 3B is a cross-sectional view for explaining inter-layer parasitic capacitance in the structure of FIG. 3A. The capacitance between the first layer 1041 as the first coil antenna and the second layer as the second coil antenna is shown therein. Other reference numerals in FIG. 3B are the same as in FIG. 3A.

$$C = \epsilon_0 \epsilon_r S/d \qquad \text{(Eq. 5)}$$

The following description is now made of the mode which utilizes the mirror effect of a coil antenna. It is generally known that if a metallic plate is present in the vicinity of an electric charge, the same magnetic field lines as with the case of an inverse charge being present at a face symmetry position of the metallic plate are drawn by the mirror effect. A current-carrying coil antenna and a circuit surface of a semiconductor chip constituted by aluminum or the like are also in the same relation. If a mirror image is present at a symmetric position of the coil antenna relative to the circuit surface, the same magnetic field lines as above are generated. The place where a mirror image is formed, therefore, differs between the case where an integrated circuit of the semiconductor chip is located just under the coil antenna wiring (FIG. 4A) and the case where the said integrated circuit is located in the interior of the coil antenna (FIG. 4C). FIG. 4A is a diagram explaining how a metallic plate 110 forms a mirror image relative to an electric path 151. The electric path 151 forms an alternate magnetic field 203 therearound and, with the metallic plate 110, a mirror image thereof, i.e., a mirror image 152 of the electric path, and an alternate magnetic field 204 based on the mirror image are formed. FIG. 4B shows the state of magnetic field lines in the case where a conductor 110 is present under a concrete coil surface. The electric path 151 using coil forms the alternate magnetic field 203, and with the conductor 110, the mirror image 152 of the electric path and the alternate magnetic field 204 based on the mirror image are formed. As a result, on the paper surface of FIG. 4B, vertical magnetic field lines weaken each other, while horizontal magnetic field lines 205 strengthen each other. On the other hand, FIG. 4C shows the state of magnetic field lines created in the case where the metallic plate 110 is located in the interior of the coil antenna. The electric path 151 using coil forms the alternate magnetic field 203, and the mirror image 152 of the electric path, as well as the alternate magnetic field 204 based on the mirror image, are formed at a catercorner position relative to the metallic plate 110 in the electric path 151. As a result, the magnetic field lines 205 in the vertical direction on the paper surface of FIG. 4D strengthen each other.

Thus, in the case where the circuit surface of the semiconductor chip is located just under the coil antenna, the magnetic field lines of coil antenna and that of the mirror image weaken each other, so that the magnetic flux Φtag passing through the coil antenna is diminished, as shown in FIG. 4B. On the other hand, when the coil antenna is located at a face symmetry position with respect to the circuit surface of the semiconductor chip, the magnetic field lines in the vertical direction strengthen each other, as the principle thereof is shown in FIG. 4C, resulting in that the effect of increasing the magnetic flux Φtag is attained as in FIG. 4D.

As described above in detail, the coil antenna has a high parasitic capacitance and a high inductance such that the reactance thereof at a desired frequency approaches zero, and a chip circuit is disposed in the interior of the coil antenna, whereby there is attained an effect of enhancing the communication characteristics.

According to the present invention, in a semiconductor chip having a coil antenna, it is possible to ensure a satisfactory communication using the semiconductor chip in environments suitable for uses while suppressing an increase in size of the semiconductor chip. Moreover, electromagnetic coupling type communication using a semiconductor chip having a coil antenna can be effected at satisfactory communication efficiency while suppressing an increase in size of the communication system.

DETAILED DESCRIPTION OF THE INVENTION

Preferred embodiments of the present invention will be described in detail hereinunder with reference to the accompanying drawings. It goes without saying that the present invention is not limited to the following embodiments and that semiconductor chips described in the following embodiments may be combined as necessary.

First Embodiment

Figure 1:
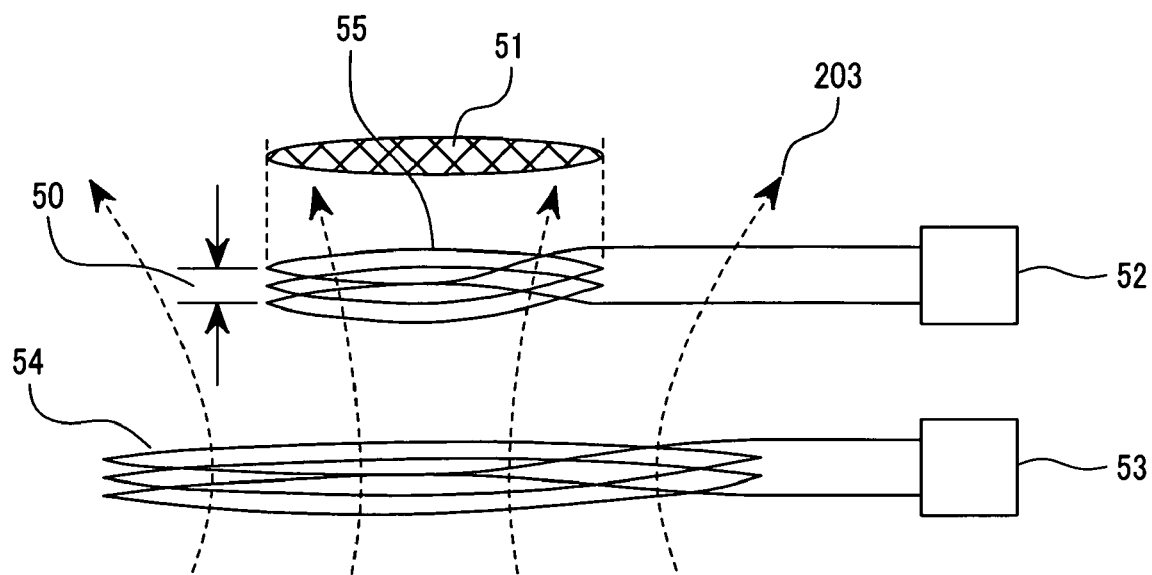
FIG. 1 is a schematic diagram showing electromagnetic coupling.
Figure 2A:
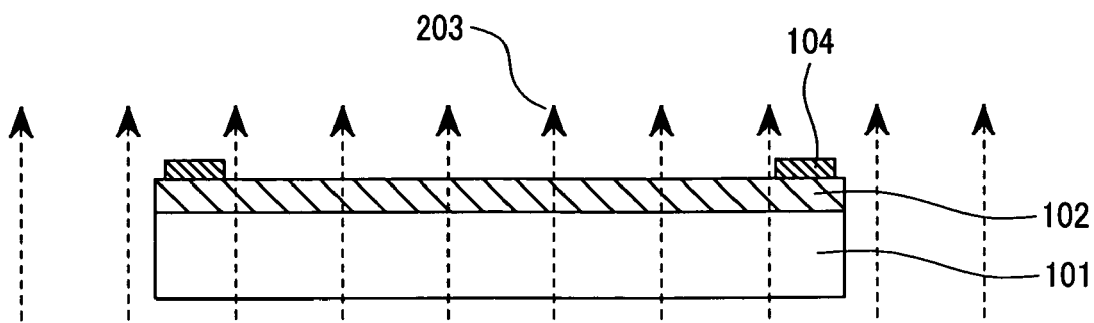
FIG. 2A is a schematic diagram illustrating a state of magnetic field lines in the absence of a magnetic material.
Figure 2B:
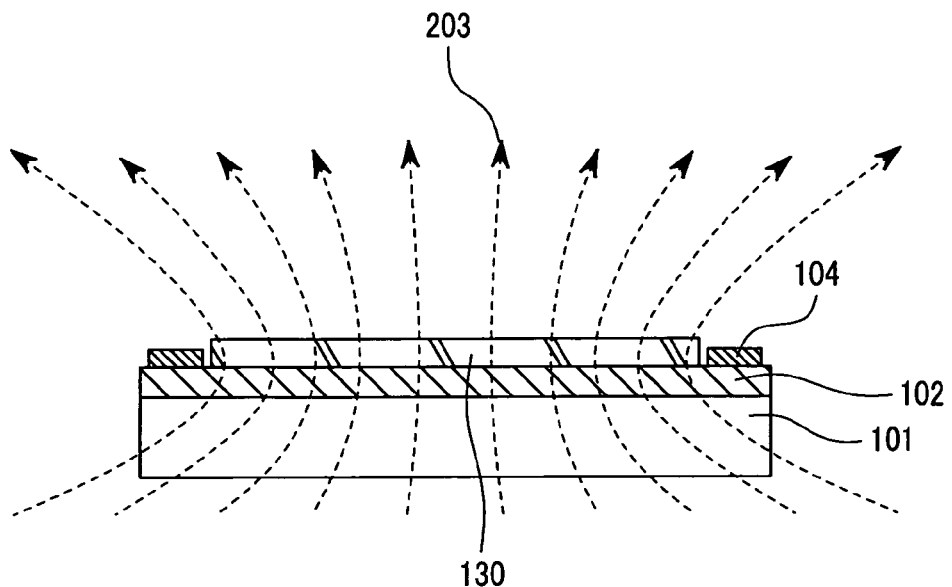
FIG. 2B is a schematic diagram illustrating a state of magnetic field lines in the presence of a magnetic material.
Figure 3A:
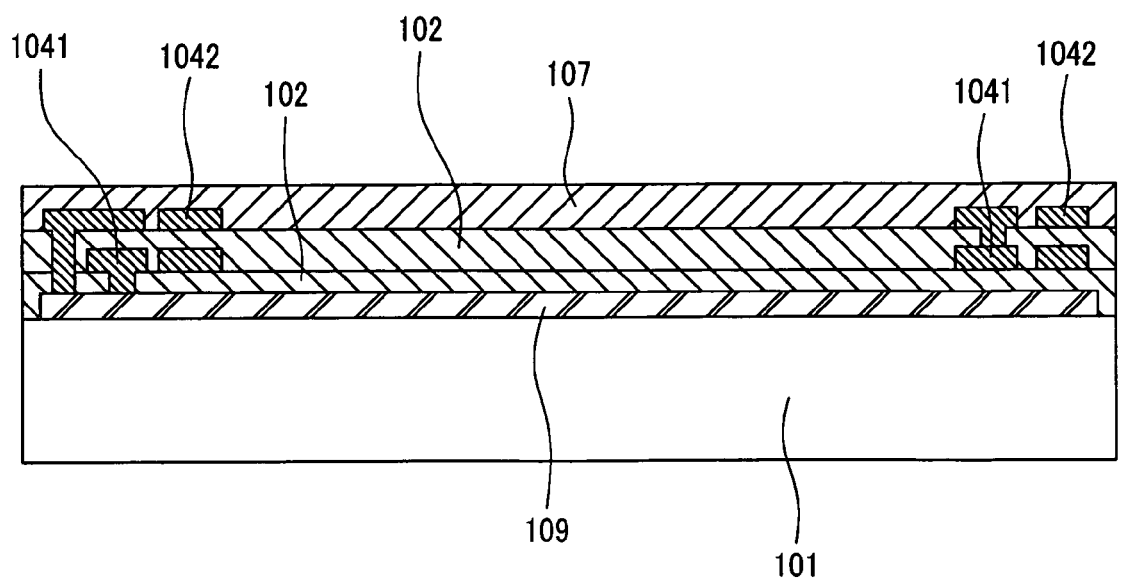
FIG. 3A is a cross-sectional view of a semiconductor chip, showing a coil antenna of a two-layer structure.
Figure 3B:
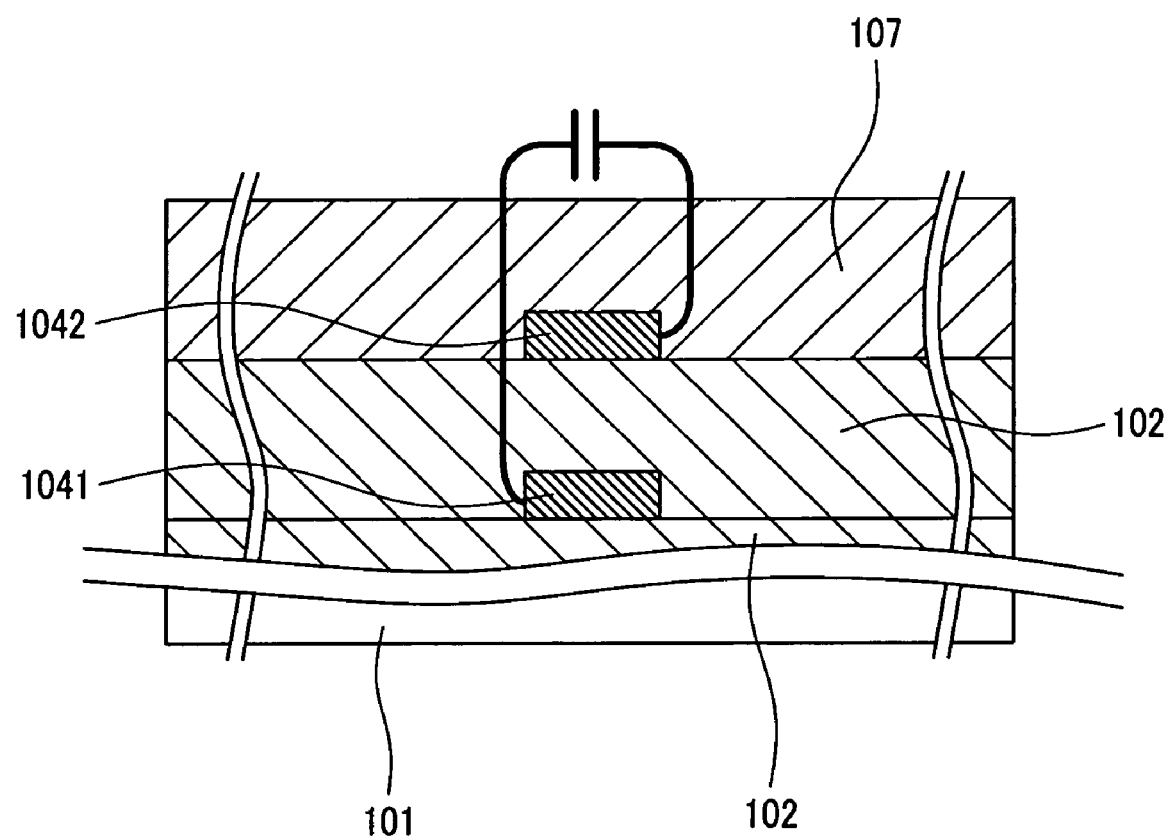
FIG. 3B is an explanatory diagram of a parasitic capacitance between layers.
Figure 4A:
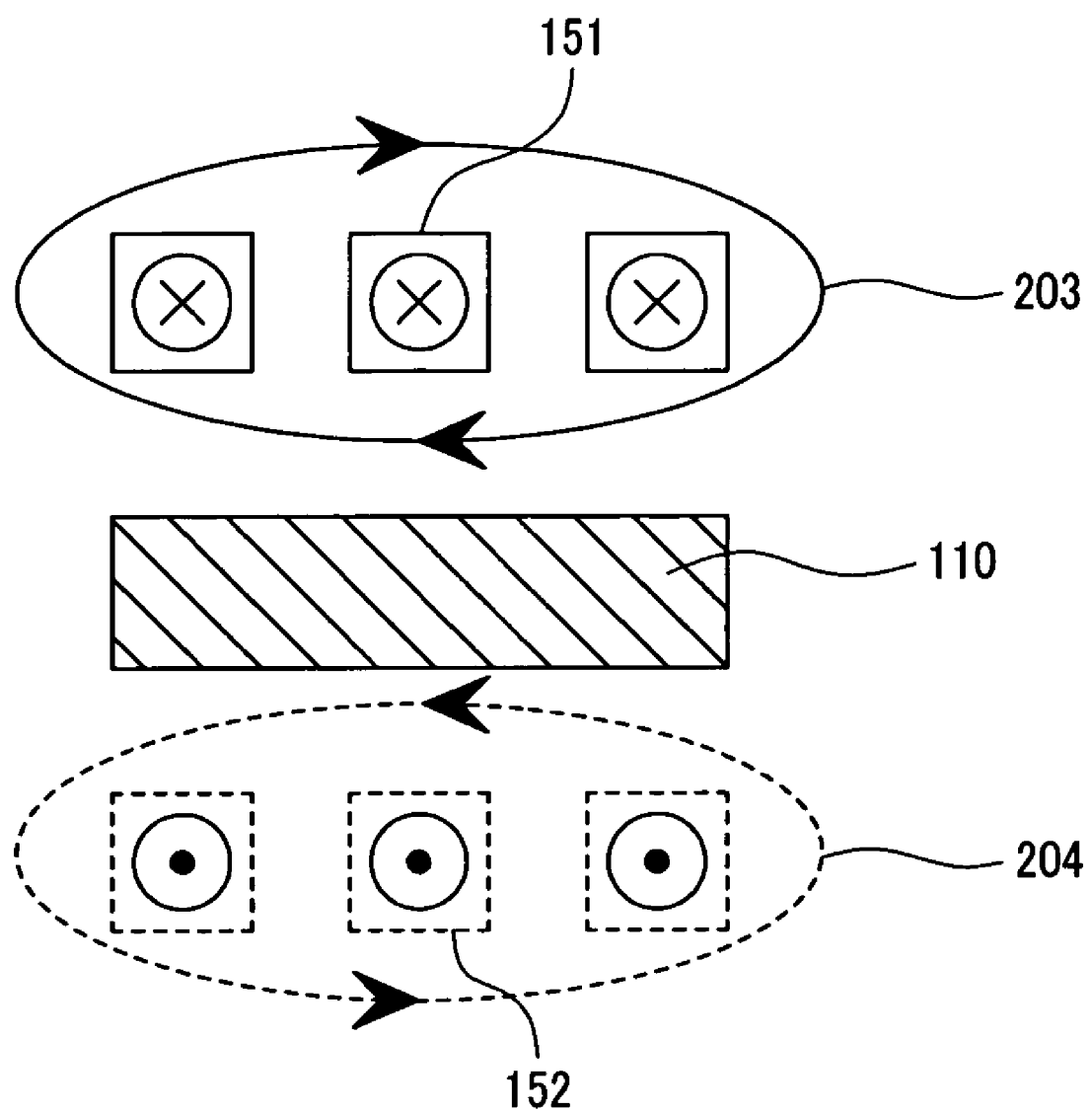
FIG. 4A is a diagram explaining a principle of a mirror image formed by a current transmission line and a metallic plate.
Figure 4B:
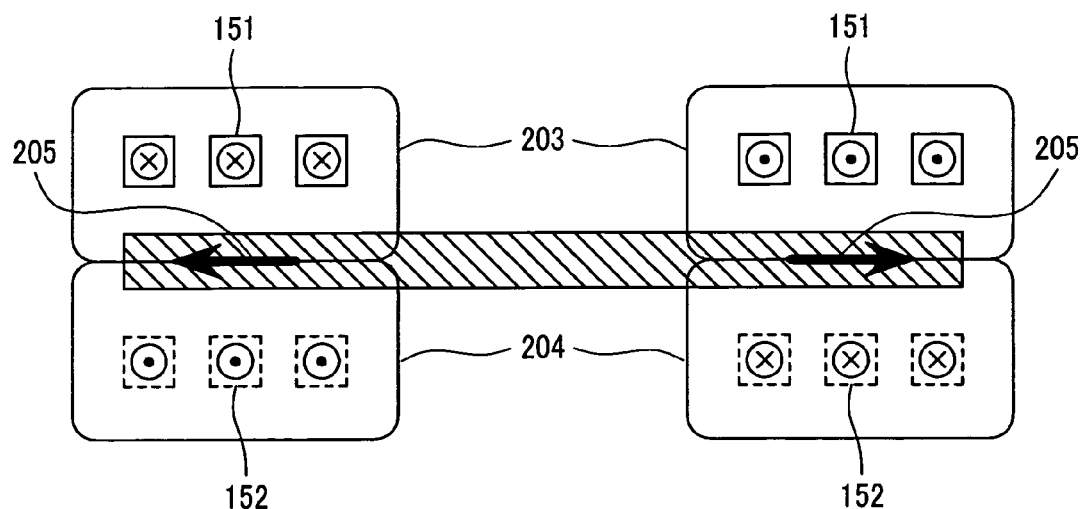
FIG. 4B is a diagram explaining a principle of a mirror image formed when a semiconductor circuit surface is present under an antenna.
Figure 4C:
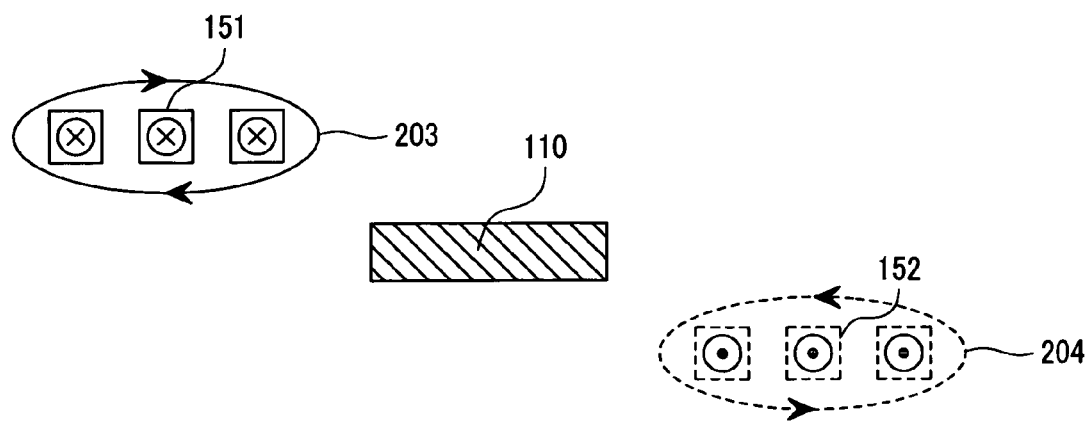
FIG. 4C is a diagram explaining a principle of a mirror image formed when a metallic plate is present in the interior of a current transmission line.
Figure 4D:
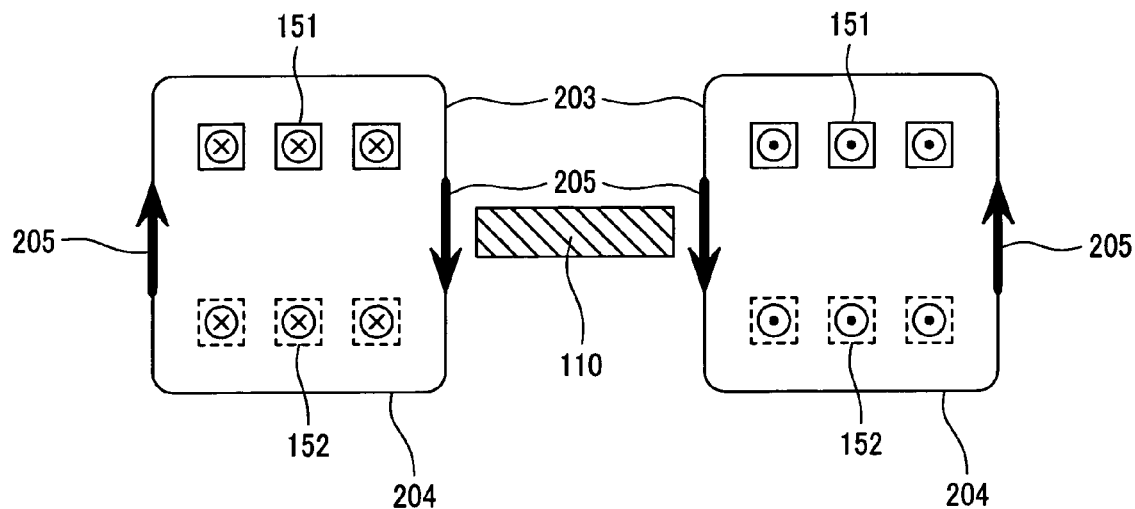
FIG. 4D is a diagram explaining a principle of a mirror image formed when a semiconductor circuit surface is present in the interior of a coil antenna.
Figure 5:
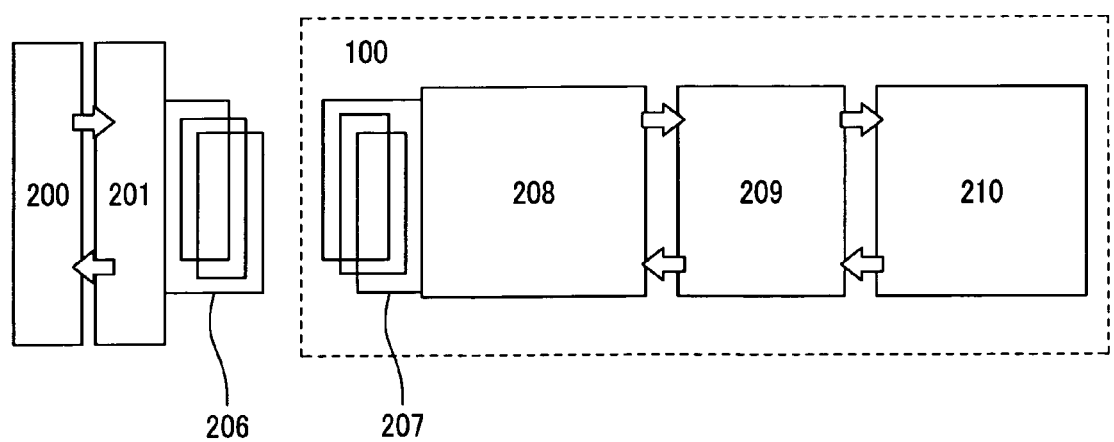
FIG. 5 is a block diagram of a semiconductor chip having a sensor function according to a first embodiment of the present invention.

The construction of a semiconductor chip having a sensor function according to a first embodiment is shown schematically in FIG. 5. A reader/writer 201 is disposed with respect to the semiconductor chip indicated at 100. The reader/writer 201 has the function of transmitting an alternate magnetic field to the semiconductor chip 100 having a sensor function and receiving a reply from the same chip. The reader/writer 201 is controlled by a controller 200 such as a PC (Personal Computer). A spiral transformer 206 or the like is used in the transmitter of the reader/writer 201.

On the other hand, the semiconductor chip 100 having a sensor function is in the form of an individual chip obtained by dicing and an internal configuration thereof, when classified according to functions, can be divided into an antenna section 207, an RF section 208, a control section 209, and a sensor section 210. The antenna section 207 is adapted to receive an alternate magnetic field 203 necessary for driving the semiconductor chip 100 from the external reader/writer 201. The alternate magnetic field 203 supplied through the antenna section 207 is extracted as electric power or a clock necessary for driving the semiconductor chip 100 and is used for demodulation of a received signal, modulation of a transmitted signal, and conversion of clocks. In addition, the alternate magnetic field 203 drives the sensor section 210 and stores detected signals in a memory provided within the control section. A detecting substance corresponding to an object of measurement is formed in the sensor section 210. The result of detection performed in accordance with the control section 209 is converted to an electric signal, which electric signal is then sent to the RF section 208 and is transmitted from the antenna section 207 by sub-carrier.

Figure 6:
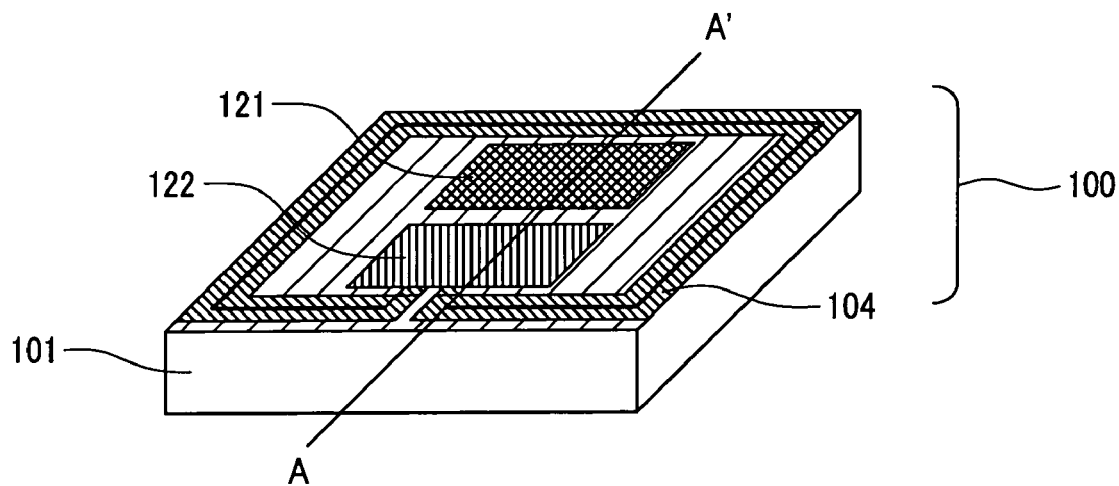
FIG. 6 is a perspective view showing a semiconductor chip formed with a sensor and a coil antenna.
Figure 7:
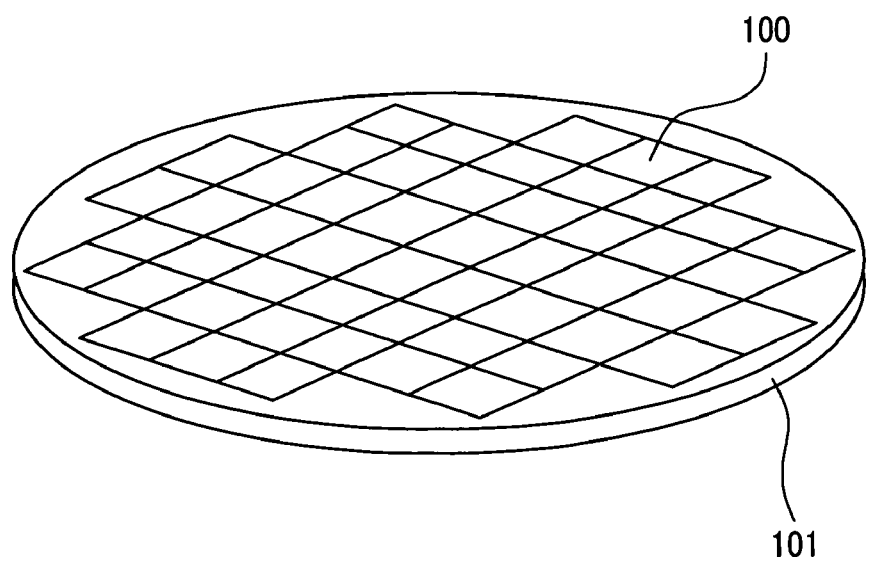
FIG. 7 is a perspective view of a wafer with semiconductor chips arrayed thereon.
Figure 8A:
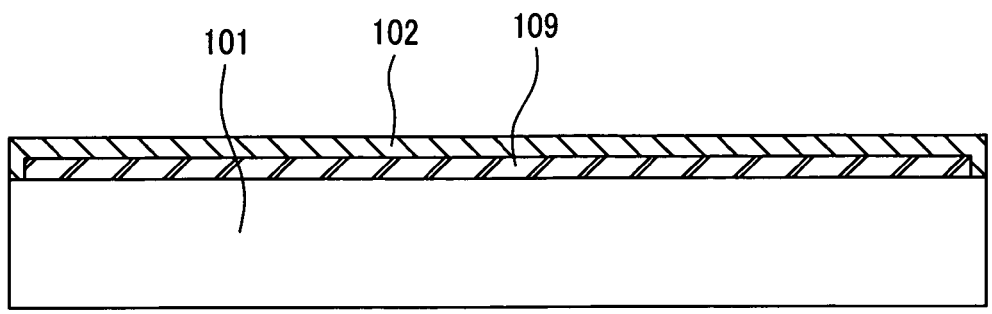
FIG. 8A is a cross-sectional view of the semiconductor chip, showing an initial process in the course of manufacture of the chip in the first embodiment.
Figure 8B:
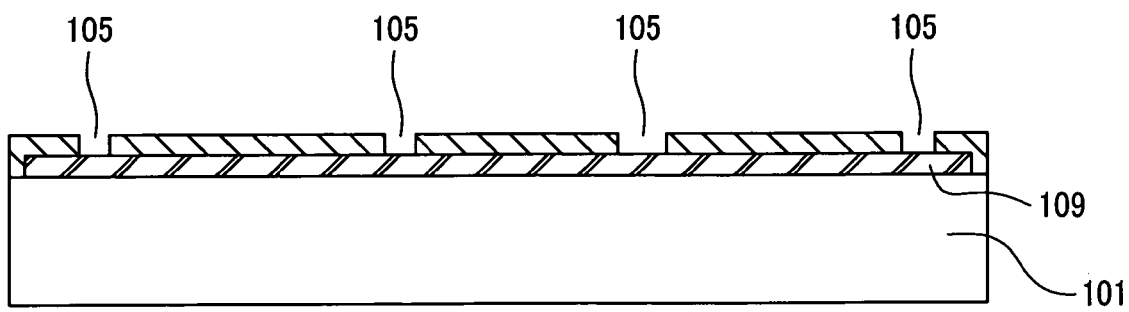
FIG. 8B is a cross-sectional view of the semiconductor chip, showing a subsequent process in the course of manufacture of the semiconductor chip.
Figure 8C:
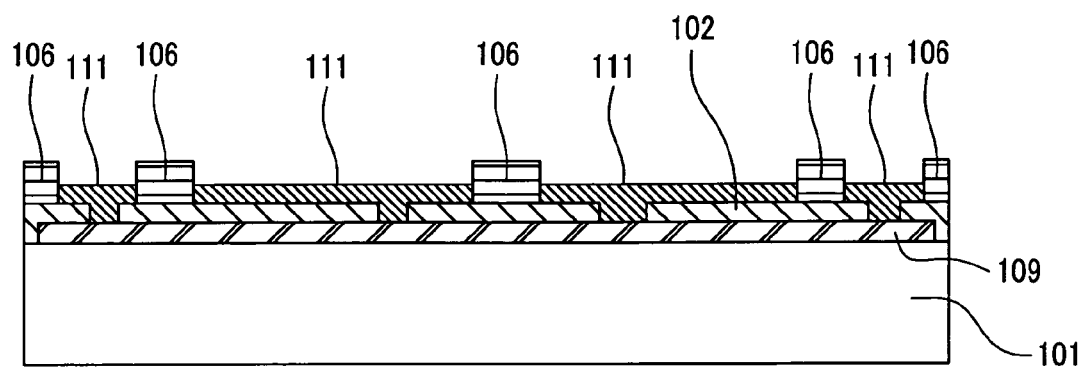
FIG. 8C is a cross-sectional view of the semiconductor chip, showing a further process in the course of manufacture of the semiconductor chip.
Figure 8D:
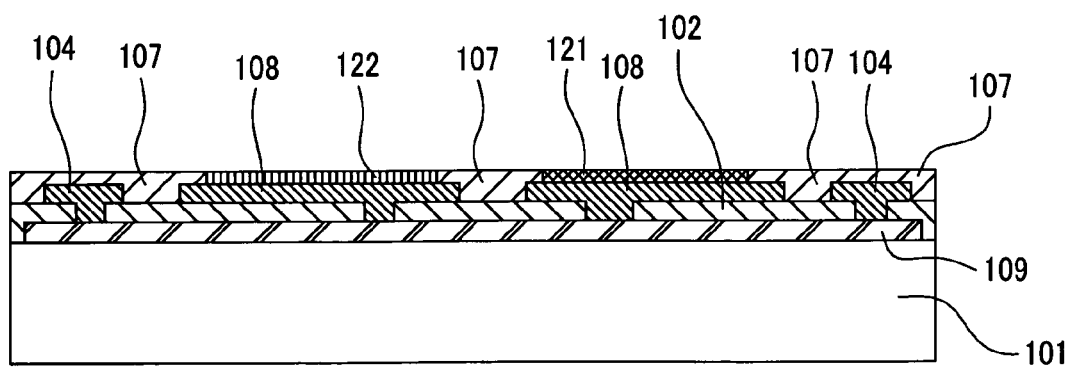
FIG. 8D is a cross-sectional view of the semiconductor chip, showing a still further process in the course of manufacture of the semiconductor chip.
Figure 8E:
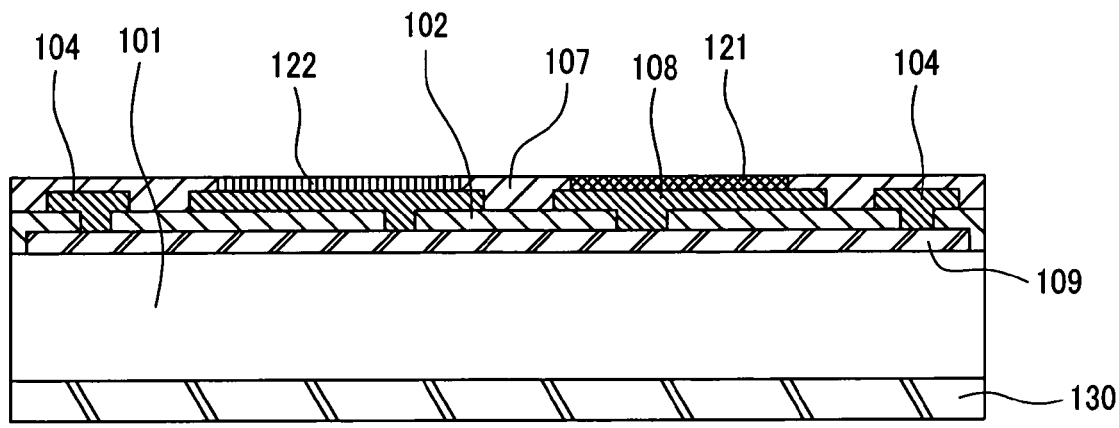
FIG. 8E is a cross-sectional view of the semiconductor chip, showing a still further process in the course of manufacture of the semiconductor chip.

FIG. 6 is a perspective view of the semiconductor chip 100 having a sensor function and constructed as above and FIG. 8E is a cross-sectional view of the chip taken on line A-A' in FIG. 6. FIG. 7 is a perspective view showing an example of a semiconductor wafer 101 in which semiconductor chips 100 are originally formed. That is, the RF section 208 and the control section 209 are formed on the silicon wafer 101 in a pre-process in a semiconductor manufacturing process. Each semiconductor chip 100 on the semiconductor wafer 101 are cut out from the same wafer.

An example of a process for forming the antenna section 207 and the sensor section 210 on such an integrated circuit is shown in FIG. 8 and an explanation thereof will now be given. FIG. 8A is a cross-sectional view of the semiconductor chip, showing a process for forming a polyimide film as an insulating layer on a silicon substrate with an integrated circuit formed thereon. FIG. 8B is a cross-sectional view of the semiconductor chip, showing a through hole-drilling process for allowing electrodes of the RF section and terminals of the sensor section in the integrated circuit to open. FIG. 8C is a cross-sectional view of the semiconductor chip, showing a process for forming a coil antenna by a semi-additive process. FIG. 8D is a cross-sectional view of the semiconductor chip, showing a process for forming a protective polyimide film and the sensor section. FIG. 8E is a cross-sectional view of the semiconductor chip, showing a state in which a magnetic material is disposed on the back side of the integrated circuit surface.

As in FIG. 8A, a polyimide film 102 serving as an insulating layer is formed on the silicon wafer 101 which has an integrated circuit section 109 of each semiconductor chip. Examples of methods for forming the polyimide film 102 include a method wherein a liquid type polyimide is spin-coated and cured and a method wherein film-like polyimide layers are stacked and bonded one on another.

Next, a description will be given of the through hole forming process for allowing electrodes of the RF section 208 and terminals of the sensor section 210 to open (FIG. 8B). As an example, reference is here made to a method in which through holes 105 are formed by photolithography with use of a photo-sensitive polyimide as the liquid type polyimide. Electrodes of the RF section 208 and terminals of the sensor section 210 are allowed to open through an exposure and development process for the photo-sensitive polyimide with use of a mask which conforms to positional information on the electrodes of the RF section 208 and the terminals of the sensor section 210.

There also may be adopted a method wherein through holes are formed by dry processing. For example, a method wherein a laser beam from a laser positioned by optical parts, including a galvanometer mirror, is directed to the polyimide film 102, does not require the use of a processing mask. To form through holes of a finer diameter while controlling the generation of a residue caused by carbonization of the resin, it is preferable to use an ultraviolet laser capable of ablation drilling, an example of which is a harmonic YAG laser. Even with use of a carbon dioxide laser, through holes of a small diameter can be formed if the residue is removed, for example, by dry etching with use of a reactive gas.

Figure 9:
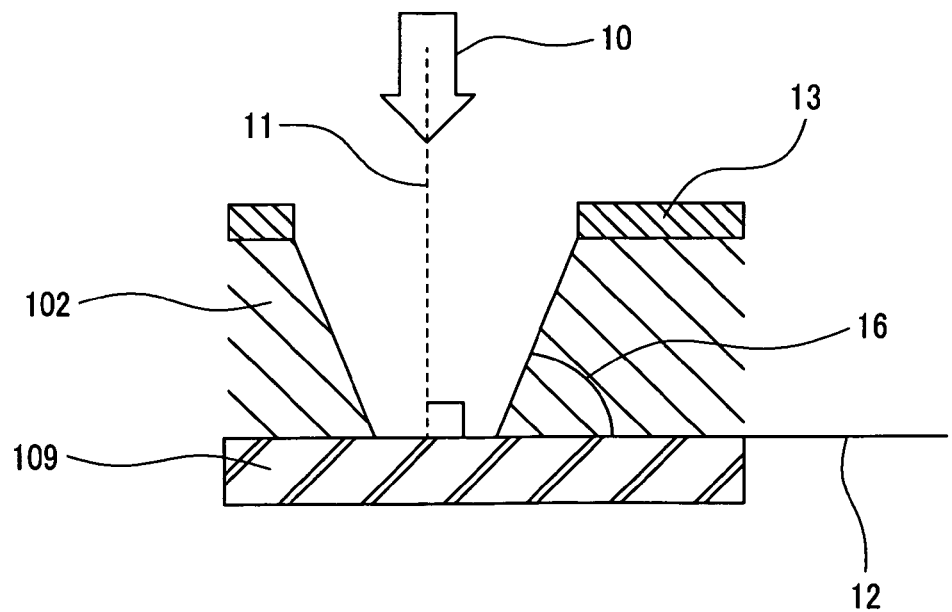
FIG. 9 is an explanatory diagram showing a taper angle in a through hole.

A method capable of ensuring high alignment accuracy is to be described by way of example of using a metal mask. A sputtered film of aluminum is formed on a polyimide film. Photolithography of a photo-sensitive resist is performed and etching of aluminum is performed using a mixed acid containing phosphoric acid as a main component. Thus, the aluminum films are removed from the electrodes of the RF section 208 and the terminals of the sensor section 210. Dry etching is continued using a laser beam or a reactive gas until exposure of the electrodes of the RF section 208 and the terminals of the sensor section 210 to form through holes of as very small as about 10 to 50 μm in diameter in the polyimide film. In the case of using a laser, it is preferable to use an ultraviolet laser in which ablation drilling is predominant, such as an excimer laser. It is known that the angle between a plane 12 perpendicular to a laser optical axis 11 and a side wall of a through hole, i.e., a taper angle 16 shown in FIG. 9, can be controlled by adjusting the energy density on a processing surface. FIG. 9 shows a state of opening of the polymer resin film 102 formed on the semiconductor integrated circuit section 109. Numeral 13 denotes a processing mask and numeral 10 denotes a processing laser. When the energy density is enhanced, the taper angle becomes larger but does not exceed 90°. Further, the carbonizing action of the resin is small and hence the generation of residue can be suppressed, so that cleaning after the processing can be made unnecessary or can be lightened.

Figure 10A:
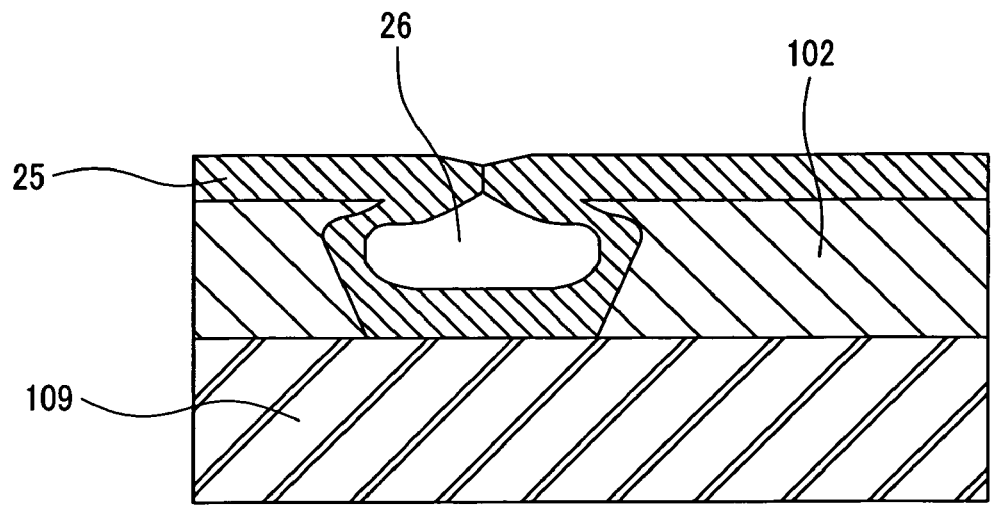
FIG. 10A is a diagram explaining a state of defective sputtering for the through hole with the taper angle exceeding 90°.
Figure 10B:
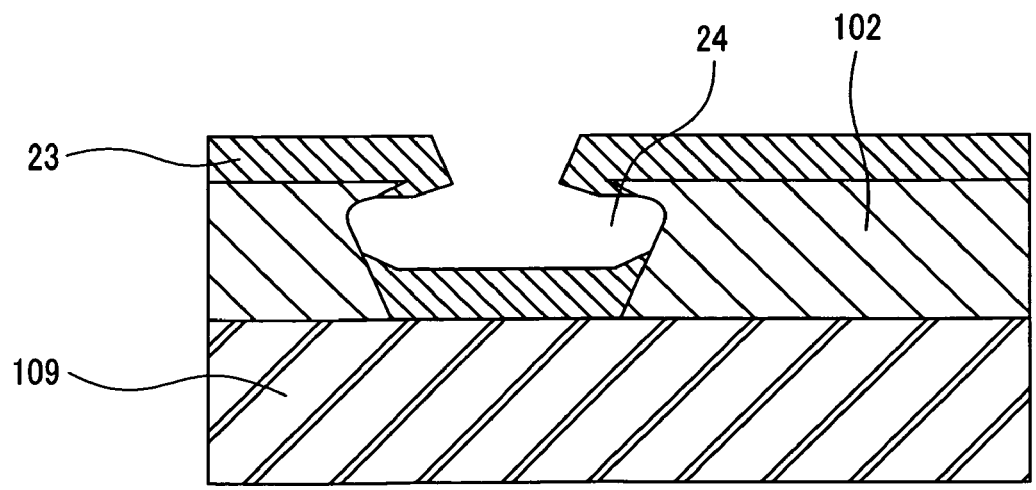
FIG. 10B is a diagram showing a state of defective plating for the through hole with the taper angle exceeding 90°.

When wiring is made in the through holes, if the taper angle is larger than 90°, the following trouble will occur. If a wet process such as plating is performed, in some cases, in a plating layer 25, an upper portion of each through hole is first closed as in FIG. 10A and then an unplating part 26 is formed within the through hole. In the case of forming a metallic film by dry processing such as sputtering, a sputtered film 203 of a uniform thickness cannot be formed as in FIG. 10B. From the standpoint of preventing the occurrence of such an inverse taper angle, the laser processing is an advantageous processing method.

In the use of a reactive gas, a reactive ion etching method is mentioned as an example which uses oxygen gas as a main reactive gas. Ion impulse or oxidizing action of oxygen dominates the processing. By adjusting the gas pressure and the processing time, it is possible to control the shape of each through hole so that the taper angle of the through hole does not exceed 90°, i.e., does not become an inverse taper angle. With a reactive gas, it is possible to form a through hole with a taper angle of 90° or so. The aluminum film is removed by dipping in an aqueous sodium hydroxide solution. FIG. 8B is a cross-sectional view showing a state in which the through holes 105 have been formed in the manner described above.

Next, chromium and copper films are formed successively by sputtering onto the polyimide film including the side wall of each through hole. With the thus-stacked film as a seed film, resist patterning and copper plating 111 are performed by what is called a semi-additive process. Subsequent pattern separation forms a coil antenna 104 of a spiral figure and a sensor electrode section 108 connected to the terminals of the sensor section 210. At the same time, copper is filled up within the through holes 105 to form through hole wiring connection between the electrodes of the RF section 208 and the coil antenna 104.

After removal of the resist, a polyimide film 107 for protecting the coil antenna (FIG. 8D) is formed, whereby the occurrence of leakage current between coils can be prevented when the semiconductor chip 100 having a sensor function is used in an electrolyte such as a solution.

Next, by the same method as the above through hole forming process, the sensor electrode section connected to the terminals of the sensor section 210 is exposed and a sensitive film 122 sensitive to the material to be measured and a reference electrode 121 are formed in a suitably selected manner. It is preferable that the aforesaid sensor be formed in the area surrounded with the coil antenna 104 because it is possible to enlarge the loop area of the coil antenna 104, as shown in the cross-sectional view of FIG. 8D.

Figure 11:
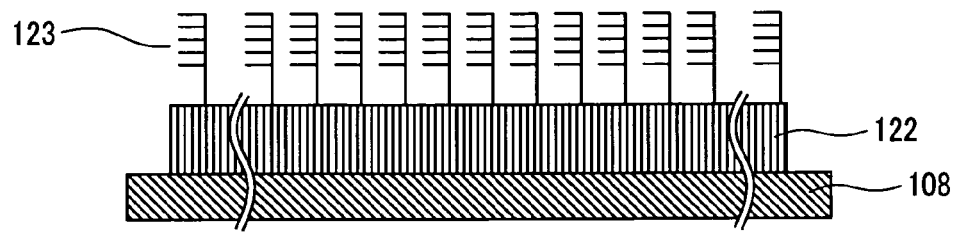
FIG. 11 is a schematic diagram of an ion sensitive FET using an organic film.

The type of the sensitive film differs depending on the material which it detects as a sensor or on a physical quantity. For example, silicon nitride, tin dioxide, and tantalum oxide are mentioned as examples of film materials of an ion sensitive FET. This is also true of the sensor film for detecting DNA as a material to be measured. In connection with the semiconductor chip 100 having a sensor function and constructed as above, FIG. 11 is an enlarged, schematic cross-sectional view of a sensor wherein an organic material as an object of measurement, e.g., a single-strand DNA having an array complementary to a single-strand DNA, is disposed on the ion sensitive FET 122. It is known that there is an individual difference in the sequence of symbols of DNA. If a DNA of a sequence conforming to the sequence of symbols is formed on the sensor, both adsorb each other. Since the DNA is slightly charged negative, a change in potential of the sensor section 210 can be monitored by the adsorption. In this case, if the semiconductor chip is placed into a sample solution, the sensor surface will be exposed to various environments. In particular, when the semiconductor chip is placed into liquid, an adsorbed material will adhere to the sensor surface. It is difficult to remove only the adsorbed material and make refreshing. Consequently, when sensing operation is performed a plurality of times using the same semiconductor chip 100 having a sensor function, it is impossible to obtain a high detection accuracy. To obtain highly reliable measurement data, therefore it is preferable that the semiconductor chip 100 having a sensor function be made disposable.

As an example of the reference electrode there is mentioned an electrode formed by plating nickel about 2 µm in thickness on the sensor electrode section 108 and then plating gold about 1 µm in thickness.

As shown in FIG. 8E, a magnetic material 130 is bonded to the back side of the integrated circuit surface and dicing is performed into individual chips to obtain the semiconductor chip 100 having a sensor function. Since the concept of the semiconductor chip itself having a sensor function is known, a detailed explanation thereof will here be omitted.

The semiconductor chip 100 having a sensor function and fabricated as above is approximated to the transformer 206 as an alternate magnetic field generator. In this case, out of alternate magnetic fields generated in accordance with the reader/writer 201 and the controller 200 such as PC, an alternate magnetic field passing through the coil antenna 104 in the semiconductor chip 100 having a sensor function causes an electromotive force to be generated in the coil antenna 104. processing is then carried out in the semiconductor chip 100. In this way, sensor information could be transmitted to the transformer 206.

In the case where a polyimide film is formed on only one surface of the silicon substrate, the stress on the front-back both sides differs due to a difference in thermal expansion coefficient of materials and due to a thermal carrier during process, thus causing a warp of the substrate. By sandwiching the silicon wafer 101 between the polyimide film 102 and an adhesive, an effect of suppressing the occurrence of warp is recognized.

In this embodiment copper is used as the material of the coil antenna. A counter electromotive force is partially consumed as Joule heat by the electric resistance of the coil antenna and therefore it is preferable that the coil antenna be formed using a material low in electric resistance. Examples of the material include gold, silver, copper, and aluminum.

Although in this embodiment reference has been made to the sensor for an organic material as an object of measurement, the sensor function is not limited thereto, but a sensor function for temperature, humidity, or light, as an object of measurement may be used. By bonding a magnetic material to the back side of the integrated circuit surface as in this embodiment, the semiconductor chip can be driven in a less expensive manner.

Second Embodiment

In a second embodiment, a semiconductor chip 99 uses its ID information as an object of radio communication. That is, the semiconductor chip 99 does not have a sensor function. For the purpose of enhancing the electromagnetic coupling of the chip, the semiconductor chip 99 is configured such that a magnetic material is disposed in a hole formed by half etching in a silicon substrate on the back side of an integrated circuit.

Figure 12:
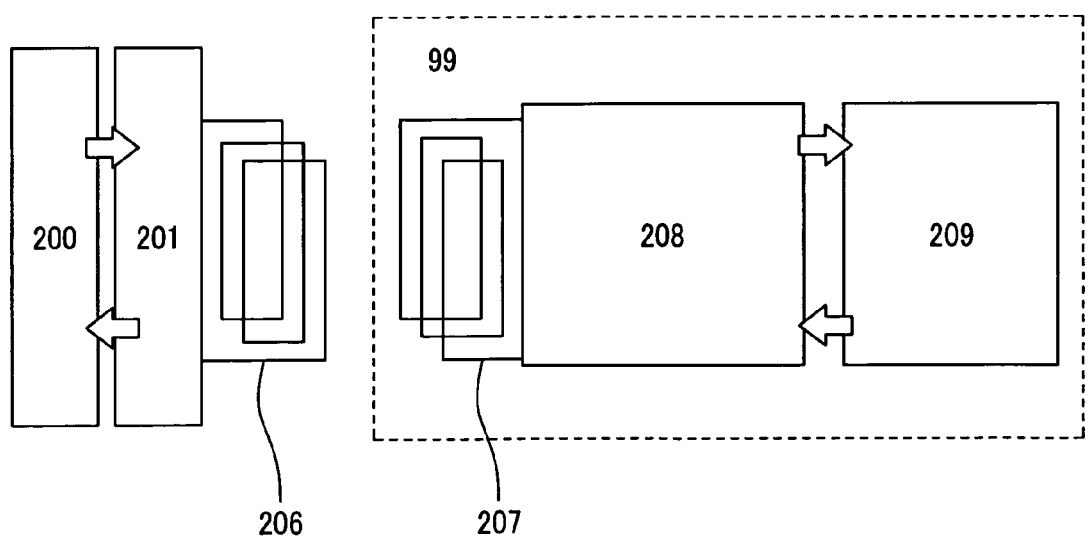
FIG. 12 illustrates the configuration of a semiconductor chip according to a second embodiment of the present invention.

The configuration of the semiconductor chip 99 of this embodiment is shown schematically in FIG. 12. A reader/writer 201 is controlled by a controller 200 such as PC and has a function of transmitting an electromagnetic field to the semiconductor chip 99 and receiving a reply from the same chip. This transmitter section is composed of a transformer 206 of a spiral figure. On the other hand, an internal configuration of the semiconductor chip 99 can be divided according to functions into an antenna section 207, an RF section 208, and a control section 209. The antenna section 207 receives an electromagnetic field from the reader/writer 201. The electromagnetic field is subjected to demodulation of the received signal, modulation of the transmitted signal, and conversion to clocks, in the RF section 208 and the control section 209. Data of the semiconductor chip 99 is sent to the RF section 208 in accordance with control made by the control section 209 and is transmitted from the antenna section 207 by subcarrier.

Figure 13:
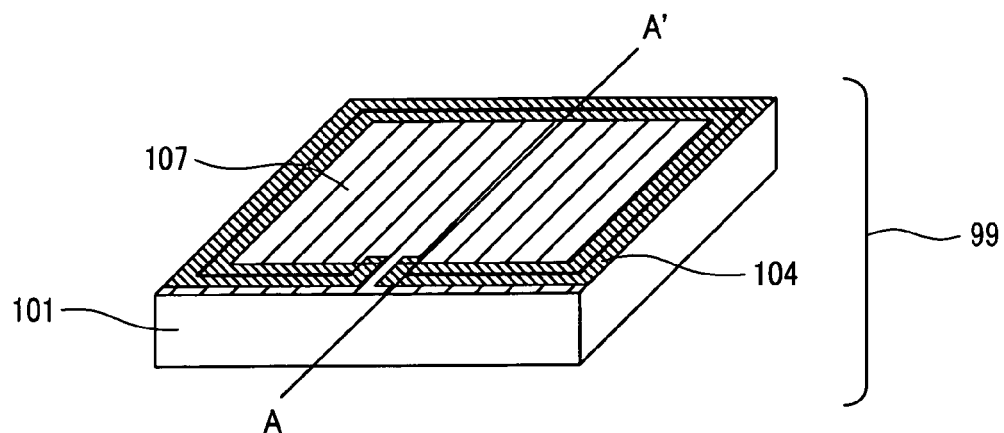
FIG. 13 is a perspective view showing the semiconductor chip formed with a coil antenna.
Figure 14:
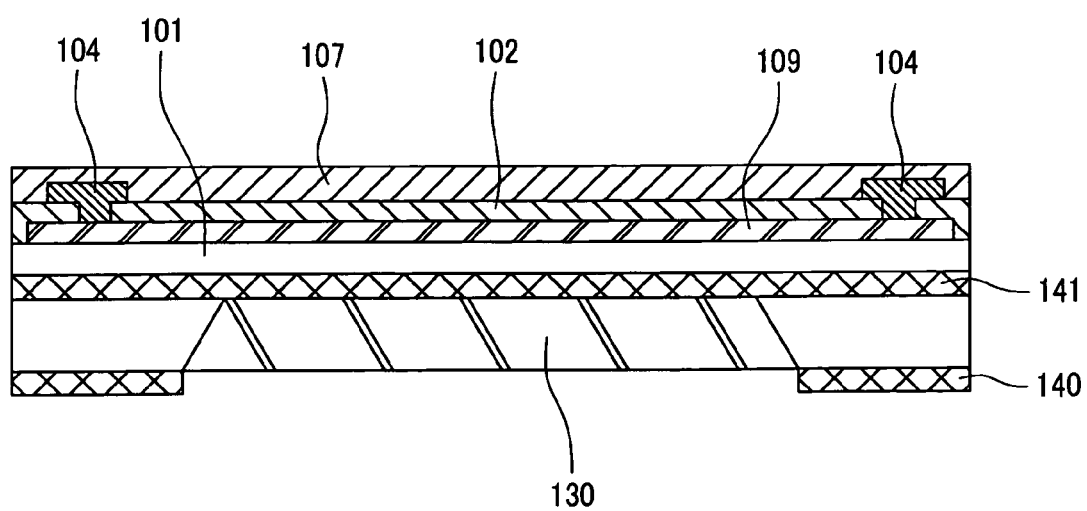
FIG. 14 is a cross-sectional view taken on line A-A' of the semiconductor chip in FIG. 13.

FIG. 13 is a perspective view of the semiconductor chip 99 having the above configuration and FIG. 14 is a cross-sectional view taken on line A-A' in FIG. 13. In FIG. 13, a protecting polyimide resin film is formed over a silicon wafer 101 and a coil antenna 104 is disposed around a desired region of the silicon wafer.

Using an SOI substrate having a silicon dioxide film on the surface thereof, the RF section 208 and the control section 209 are formed on the silicon wafer 101 by pre-process in the conventional semiconductor manufacturing process.

For example, a polyimide film is formed as a polymer film 102 on an integrated circuit surface 109 of the silicon substrate. Next, through holes are formed so as to extend through the polyimide film at positions corresponding to electrodes of the RF section 208. Chromium and copper are successively deposited by sputtering onto the polyimide film 102 including a side wall of each through hole and a coil antenna 104 of a spiral figure is formed by a semi-additive process. At the same time, copper is buried into each through hole 105 and a through hole wiring for connection between the electrodes of the RF section 208 and the coil antenna 104 is also formed. After removal of the resist, a polyimide film 107 for protecting the coil antenna 104 is formed.

A 3-µm-thick photo-sensitive resist is applied to the surface of a silicon dioxide film 140 on the back side the integrated circuit and the resist is removed by photolithography in the region where a magnetic material is to be disposed. The substrate is then dipped in a mixed solution of hydrofluoric acid and ammonium fluoride and silicon dioxide film present in apertures is etched to remove the photo-sensitive resist. Then, using an invar (Fe-36% Ni) jig, a portion on the side of the protecting polyimide film 107 is shut off from the exterior and sealed hermetically. With the silicon dioxide film 140 as mask, the exposed silicon surface is etched using an aqueous potassium hydroxide solution held at 90° C. When an interior silicon dioxide layer 141 is reached, washing and drying are performed and thereafter a magnetic material 130 is formed in the drilled hole. Examples of a method for forming the magnetic material 130 include: a method wherein a resin with magnetic particles such as particulate ferrite dispersed therein is applied or printed to the above portion and is cured; and a method wherein a metallic film is formed around or inside the hole and, with the metallic film as a seed film, nickel is plated by a semi-additive process or an iron alloy is bonded.

Incidentally, within the magnetic field, an eddy current is produced in the conductor. The resin with magnetic material particles dispersed therein is superior in suppressing the generation of such an eddy current. In particular, a resin having oxidized magnetic particles on the surface thereof is superior in this point.

Lastly, a dicing process is carried out to form the semiconductor chip 99 as one of diced chips.

The semiconductor chip 99 thus fabricated is then approximated to the transformer 206 in the reader/writer 201. Part of the electromagnetic field from the transformer 206 controlled by the controller 200 such as PC passes through the coil antenna 104 in the semiconductor chip 99, so that a counter electromotive force is generated in the coil antenna. In this way, an ID number prestored in the semiconductor chip 99 can be transmitted to the transformer 206.

If the silicon substrate is etched to excess in the substrate etching process, lowering of the process yield may result. Since the SOI substrate is used, the interior silicon dioxide layer 141 can be used as an etching stopper layer and therefore a hole having a uniform depth can be formed easily.

Although in this embodiment an aqueous potassium hydroxide solution is used for etching the silicon surface on the back side of the chip, a mixed aqueous solution of silicon hydrofluoric acid and nitric acid or hydrazine may be used. Likewise, dry etching may be adopted. Further, although in this embodiment the magnetic material is applied directly to the surface after processing, its application may be done after deposition of silicon nitride on the surface, whereby the diffusion thereof into the silicon substrate can be suppressed.

Third Embodiment

In a third embodiment, a magnetic material is disposed in accordance with another structure in the semiconductor chip 100 of the first embodiment. In all of the following examples it is preferable that a dicing process into individual chips be carried out after the formation of a magnetic material.

Figure 15:
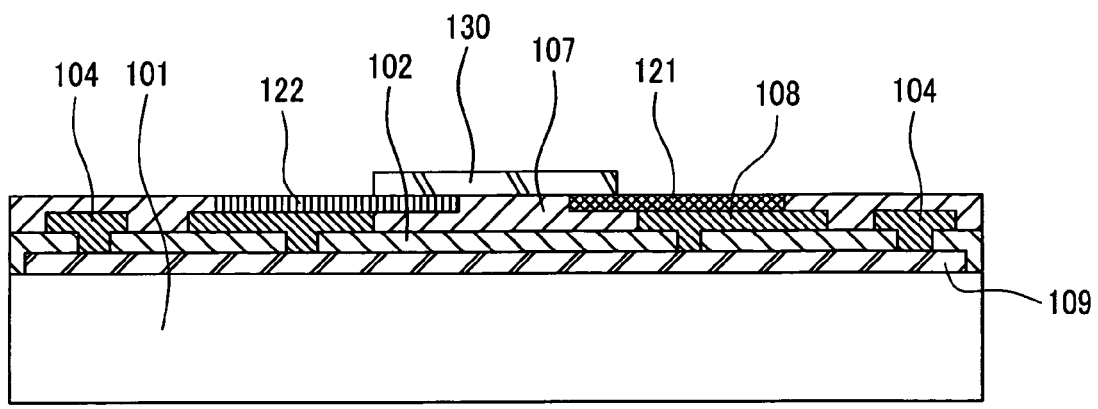
FIG. 15 is a cross-sectional view of a semiconductor chip according to a third embodiment of the present invention, with a magnetic material disposed inside a coil antenna.

FIG. 15 is a cross-sectional view showing an example in which a magnetic material 130 is bonded inside the coil antenna 104. After the coil antenna 104 is formed in the same way as in the first embodiment, the magnetic material 130 is formed by bonding so as not to overlap the ion sensitive FET 122 and the reference electrode 130. The number of processes required for affixing the sensitive material 130 is small and hence it is possible to effect a less expensive manufacture.

Figure 16:
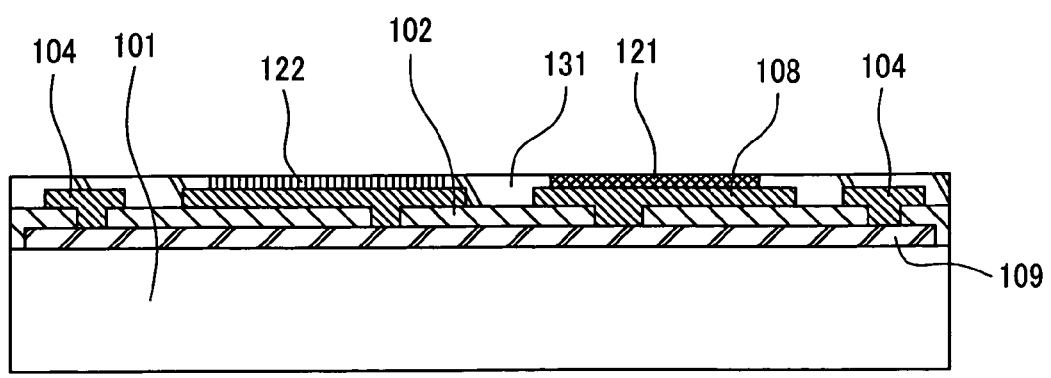
FIG. 16 is a cross-sectional view of the semiconductor chip of the third embodiment with resin stacked and bonded thereto, the resin having dispersed therein a magnetic material as a protecting polyimide.

FIG. 16 is a cross-sectional view showing an example in which a resin with a magnetic material 131 dispersed therein as the protective polyimide 107 is stacked and bonded.

In the semiconductor chip 100 having a sensor function described above, an alternate magnetic field 203 passing through the coil antenna 104 can be increased by the magnetic material 130. When communications are performed in the vicinity of 13.56 MHz with use of MN50S (a product of Hitachi Metal, Ltd.) as the magnetic material 130, it is expected that an induced voltage will be increased to about fifteen times.

Fourth Embodiment

A fourth embodiment relates to a semiconductor chip 100 provided with the coil antenna which is described in the first embodiment, but which has a multi-layer stacked structure.

Figure 17:
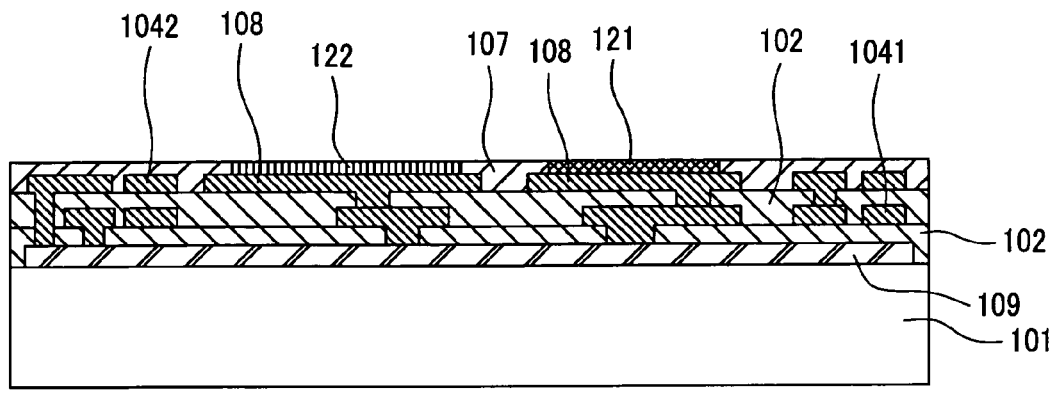
FIG. 17 is a cross-sectional view of a semiconductor chip having a coil antenna of a two-layer structure according to a fourth embodiment of the present invention.
Figure 18:
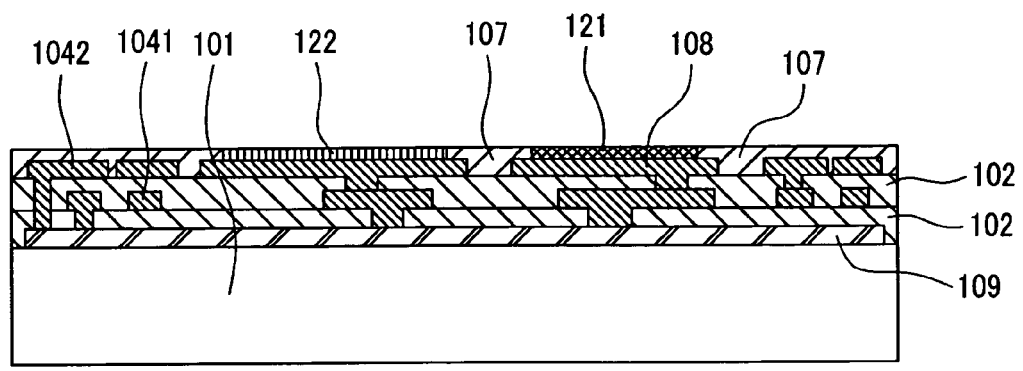
FIG. 18 is a cross-sectional view of a semiconductor chip according to the fourth embodiment wherein the two-layer coil antenna is formed at different wiring widths depending on layers.
Figure 19:
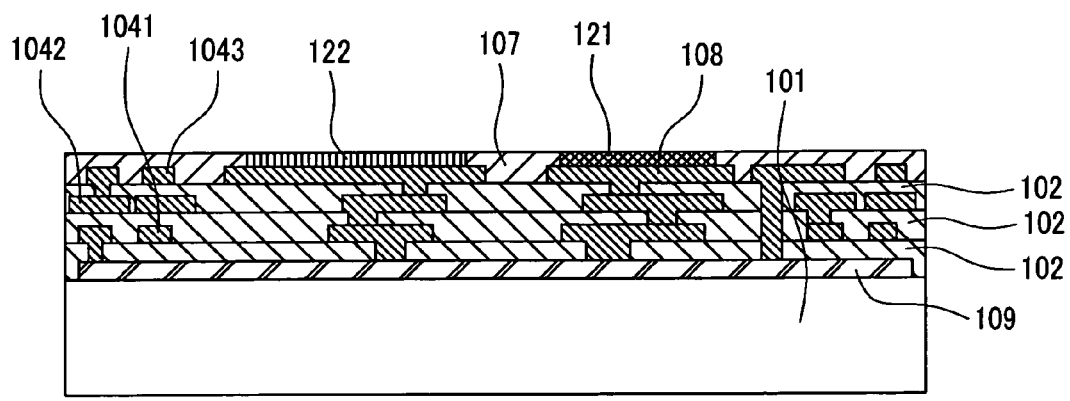
FIG. 19 is a cross-sectional view of a semiconductor chip having a coil antenna of a three-layer structure according to the fourth embodiment.

The processes from formation of the polyimide film 102 until formation of the coil antenna 104 on the silicon wafer 101 with an integrated circuit formed thereon are repeated a predetermined number of times in the same way as in the first embodiment. A protecting polyimide film 107 is formed on the coil antenna 104. The sensor electrode section 108 connected to the terminals of the sensor section 210 is exposed and a suitable sensitive film for the material as an object of measurement is selected and formed. FIGS. 17, 18, and 19, are cross-sectional views of semiconductor chips 100 having a coil antenna of a two-layer structure, a coil antenna of a two-layer structure with different wiring widths, and a coil antenna of a three-layer structure, respectively.

Figure 20:
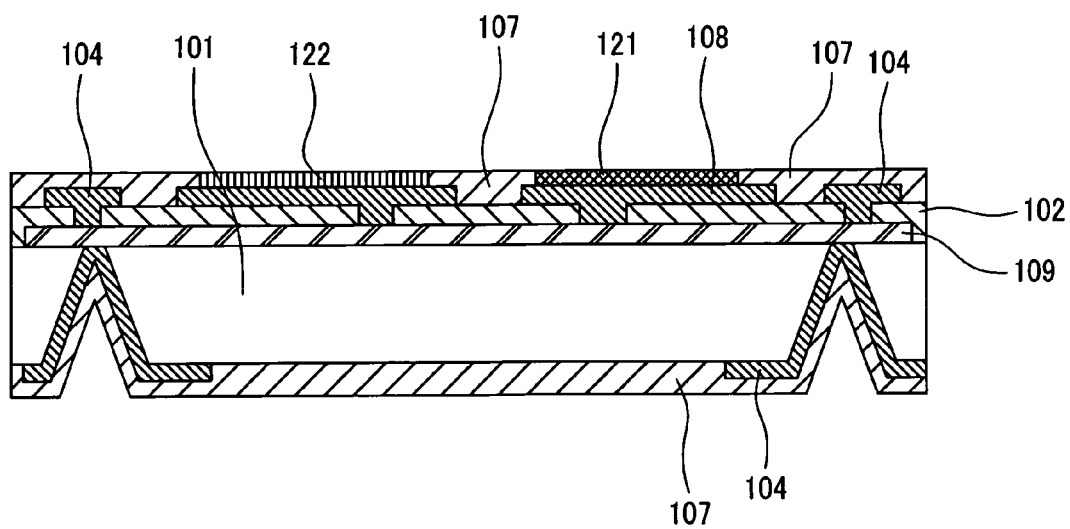
FIG. 20 is a cross-sectional view of a semiconductor chip having a coil antenna of a two-layer structure formed on front-back both sides according to the fourth embodiment.
Figure 21:
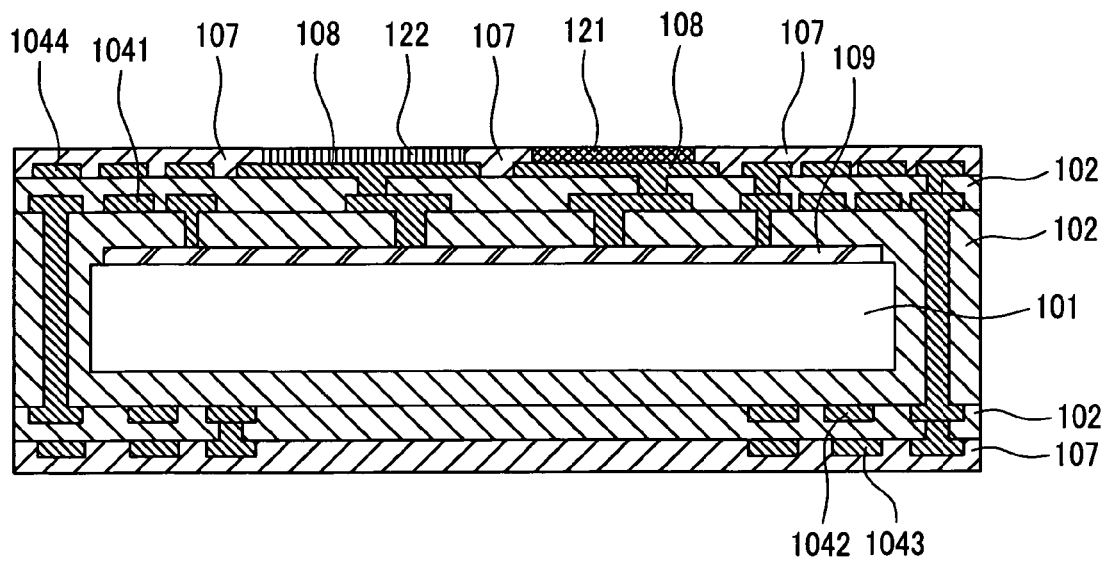
FIG. 21 is a cross-sectional view of a semiconductor chip having a coil antenna of a four-layer structure formed on front-back both sides according to the fourth embodiment.

FIGS. 20 and 21 are cross-sectional views each showing a semiconductor chip 100 having a coil antenna on both sides of the chip.

A description will now be given of the example shown in FIG. 20. The semiconductor chip 100 formed with an integrated circuit by the same method as in the first embodiment is subjected to the processes from formation of the polyimide film 102 until formation of the ion sensitive FET 122 and the reference electrode 121. Next, the silicon dioxide film is removed from a desired portion of the back-side silicon and a portion on the side of the protecting polyimide film 107 is shut off and sealed hermetically by means of an invar jig. With the silicon dioxide film as mask and using an aqueous potassium hydroxide solution, silicon etching and dry etching are performed, allowing the electrodes of the RF section 208 in the integrated circuit to be exposed. Sputtered films of chromium and copper are formed from the back side and a coil antenna 104 of copper is formed by a semi-additive process. On the integrated circuit surface side, through holes are formed in the polyimide film at the terminals of the sensor section 210 and a sensitive film for the material as an object of measurement is selected and formed to afford a semiconductor chip 100 having the sectional structure of FIG. 20.

FIG. 21 is a cross-sectional view of a semiconductor chip 100 having a coil antenna formed on both sides with use of a resin coated metal film. Examples of the resin coated metal film include a copper foil with resin which is used in a build-up substrate manufacturing process, and a polyimide sheet formed with a sputtered film. The silicon wafer 101 with the integrated circuit formed thereon is diced into individual chips. The metal foil with resin is stacked and bonded to both sides of the semiconductor chip by high-temperature vacuum press, whereby the semiconductor chip is enclosed with the resin. A dry film resist is laminated to the metal film on the side where the circuit surface is formed, followed by patterning in accordance with a subtractive process. In this way the metal film present in the connections between the electrodes of the RF section 208 and the back coil is removed. Then, laser light is directed to the resin at the metal film-removed positions to form through holes. Electroless flash plating and electroplating are performed to connect the metal film on the surface side and the metal film on the back side electrically with each other. By applying the subtractive process to the metal films on both sides a coil antenna 104 is formed and then a protecting layer 107 such as solder resist is formed. In this way, a semiconductor chip 100 having the section of FIG. 21 is obtained.

With the coil antenna 104 formed on the back side of the sensor section 210, the area of the sensor section 210 can be made large. This make it possible to improve the probability of reaction with the to-be-detected material, improve the detection accuracy, and shorten the measurement time. In the case where the reader/writer 201 is located on the bottom of a detection vessel, the surface of the coil antenna 104 can be directed to the transformer 206 in the reader/writer 201 and a high induced voltage can be obtained for the material to be detected by the sensor section 210.

Further, since the self-inductance is improved by an increase in the number of layers, it is possible to enlarge the induced voltage in the semiconductor chip 100 as the tag. Additionally, because of an improved parasitic capacitance, the capacitance of a resonance adjusting capacitor to be added to the circuit on the semiconductor chip 100 can be made small, that is, the area of the capacitor can be diminished. Since the stacking process is carried out by repeating photolithography, it is difficult to completely eliminate a positional deviation caused mainly by alignment in the exposure process. In case of making a design so that the constituent layers are equal to each other in wiring width as in FIG. 17, variations in parasitic capacitance of the coil antenna 104 become large and a discrepancy in resonance frequency occurs for each semiconductor chip 100. As shown in FIGS. 18 and 19, a manufacturing error in wiring capacitance caused by a positional deviation between coil layers can be made smaller by changing the wiring width between layers. More specifically, in connection with wiring widths (M1<M2) of adjacent coil layers M1 and M2, it is preferable for the maximum wiring width w1+d of the coil layer M1 and the minimum wiring width W2−d−δ of the coil layer M2 to be designed so that parallel wiring components overlap each other as viewed from above. In this case, the respective design values of the wiring widths of the coil layer M1 and M2 are set at w1 and w2, respectively, (w1<w2), further, the manufacturing accuracy is set at ±d, and the alignment accuracy in the exposure process at ±δ.

The semiconductor chip 100 thus fabricated is approximated to the transformer 206 in the reader/writer 201. In accordance with control made by the control unit 200 such as PC, an electromagnetic wave emitted from the transformer 206 is allowed to pass through the coil antenna 104 in the semiconductor chip 100. The semiconductor chip 100 is driven using as a power supply a large counter electromotive force generated by the above effect and data on the semiconductor chip 100 can be transmitted to the transformer 206. According to the communication characteristic obtained in this state it is possible to effect communication at a longer communication distance and with use of a coil antenna of a reduced size.

Fifth Embodiment

Figure 22:
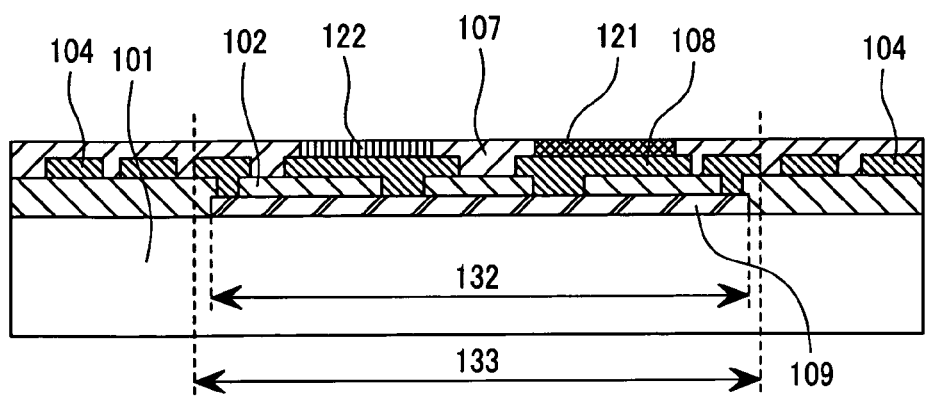
FIG. 22 is a cross-sectional view of a semiconductor chip having a coil antenna formed in an area mainly outside the profile of an integrated circuit surface according to a fifth embodiment of the present invention.

A fifth embodiment relates to the layout of the circuit surface including the RF section 208 and the control section 209 in the semiconductor chip 100. The circuit surface 109 of the semiconductor chip 100 in the first embodiment is formed in a concentrative manner in a small region so that the spacing from the circuit surface of an adjacent chip exceeds 0.1 mm, which is usually considered necessary for dicing. In the area outside an external form 132 of the circuit surface, a coil antenna 104 is formed in the same way as in the first embodiment. The external form 132 of the circuit surface is therefore received inside an internal form 133 of the coil antenna. In FIG. 22, the same portions as in the previous embodiments are identified by the same reference numerals as in the previous embodiments.

Next, dicing is performed into individual chips to obtain such a semiconductor chip 100 as shown in FIG. 22.

With respect to a semiconductor chip having a coil antenna 104 with an aluminum plate of 2.3 mm square disposed centrally, the coil antenna 104 having an external form of 2.3 mm square, a central loop area of about 0.6 mm square, and 50 turns, and a semiconductor chip 100 having an aluminum plate of 0.5 mm square, a communication characteristic evaluation was performed by electromagnetic field simulation. The aluminum plate and the coil antenna were aligned with each other.

The transformer 206 in the reader/writer 201 was designed to have a diameter of 7 mm and 5 turns. The transformer-antenna distance was set at 1 mm and communication was performed at 13.56 MHz. As a result, mutual inductances were 0.0680 μH and 0.0775 μH. Since the induced voltage in the semiconductor chip 100 as a tag and the mutual inductances are in the relation of Eq. 3, it turned out that an improvement of about 15% could be attained by this embodiment.

Sixth Embodiment

Figure 23:
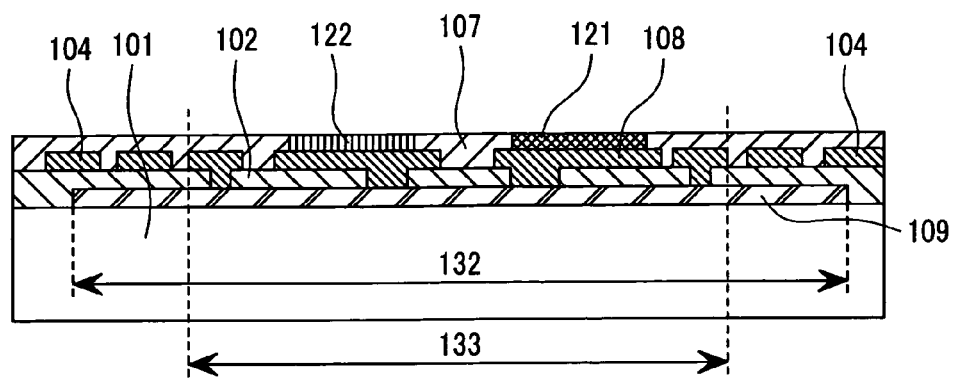
FIG. 23 is a cross-sectional view of a semiconductor chip having a coil antenna formed in an area mainly outside the profile of an integrated circuit surface according to a sixth embodiment of the present invention.

A sixth embodiment relates to the layout of a circuit surface including an RF section 208 and a control section 209 in a semiconductor chip 100. The circuit surface 109 of the semiconductor chip 100 described in the first embodiment is formed in a small region so that the spacing from the circuit surface of an adjacent chip exceeds 0.1 mm which is usually considered necessary for dicing. Thereafter, in an area mainly outside an external form 132 of the circuit surface, a coil antenna 104 is formed in the same way as in the first embodiment. Next, dicing is performed into individual chips to obtain such a semiconductor chip 100 as shown in FIG. 23. In this embodiment, an internal form 133 of the coil antenna and the external form 132 of the circuit surface occupy substantially the same area.

With the semiconductor chip 100 thus fabricated, a high induced voltage can be obtained because of a mirror effect of the coil antenna 104 induced by the chip circuit. Moreover, the size of the semiconductor chip 100 can be reduced in comparison with the fifth embodiment.

Seventh Embodiment

In a seventh embodiment, a coil antenna is formed as a multi-layer structure as described in the first embodiment, a magnetic material is disposed as in the fourth embodiment, and a mirror effect of the coil antenna induced by the chip circuit is obtained as in the fifth and sixth embodiments. For example, when MN50S (a product of Hitachi Metal, Ltd.) is used as the magnetic material, the coil antenna is formed to be a two-layer structure, and the coil antenna is positioned outside the external form of the circuit of the semiconductor chip 100, the induced voltage can be enlarged to about 20 times.

Eighth Embodiment

Figure 24A:
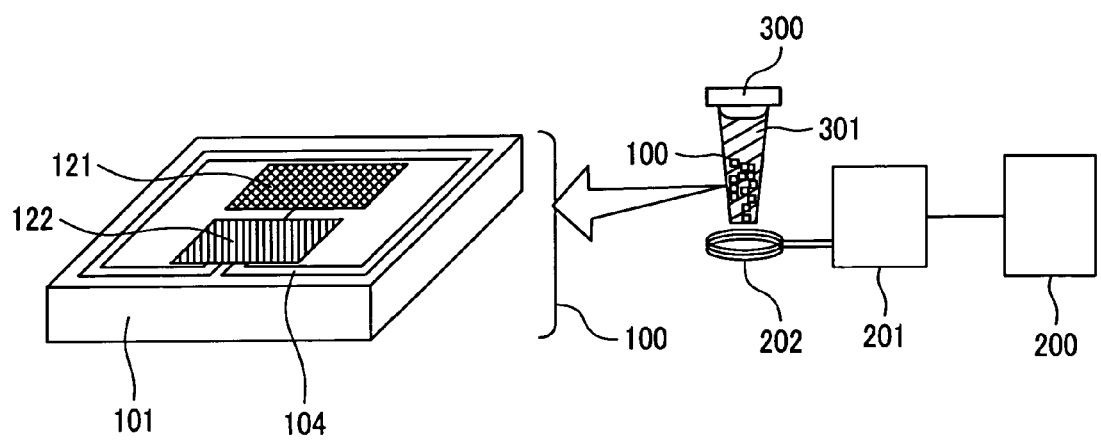
FIG. 24A is an explanatory diagram showing an outline of a DNA measuring system according to an eighth embodiment of the present invention.
Figure 24B:
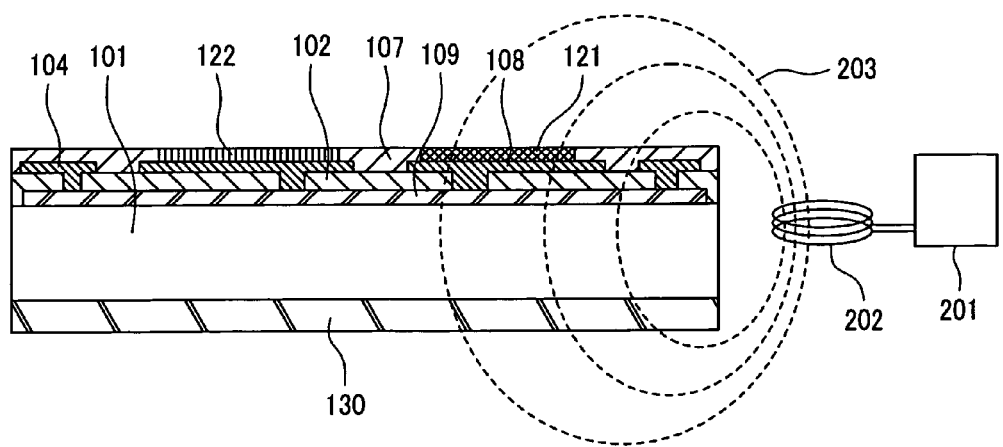
FIG. 24B is a cross-sectional view showing in a state in which a magnetic flux from a transformer passes through a coil antenna.

An eight embodiment shows a system for detecting a to-be-inspected material contained in a to-be-inspected solution which is placed within an inspection vessel, with use of the semiconductor chip 100 described in the first embodiment. FIG. 24A shows an outline of a DNA measuring system. A solution 301 which contains DNA as an object of inspection and a plurality of semiconductor chips 100 each provided with a DNA sensor section 210 having an array complementary to the DNA to be inspected are charged into an inspection vessel 300. Only the DNA having an array conforming to the DNA in the sensor section 210 is adsorbed. FIG. 24B shows how magnetic field lines 203 generated from the transformer 206 connected to the reader/writer 201 pass through the coil antenna 104. The semiconductor chip 100 is driven by a magnetic flux passing through the coil antenna in the semiconductor chip 100 and a change in potential of the sensor section 210 is monitored by the ion sensitive FET 122. In accordance with the anti-collision of ISO15693, sensor information is transmitted as a reply to the reader/writer 201 through the transformer 206. The replied information is processed in a measuring device and used to detect the presence or absence of a DNA conforming to the symbol array of the organic film. In this way, the presence or absence of a specific DNA can be measured.

Various constituent portions of the semiconductor chip shown in FIG. 24B and equivalent to those described in the previous embodiments are identified by the same reference numerals as in the previous embodiments.

Ninth Embodiment

Figure 25:
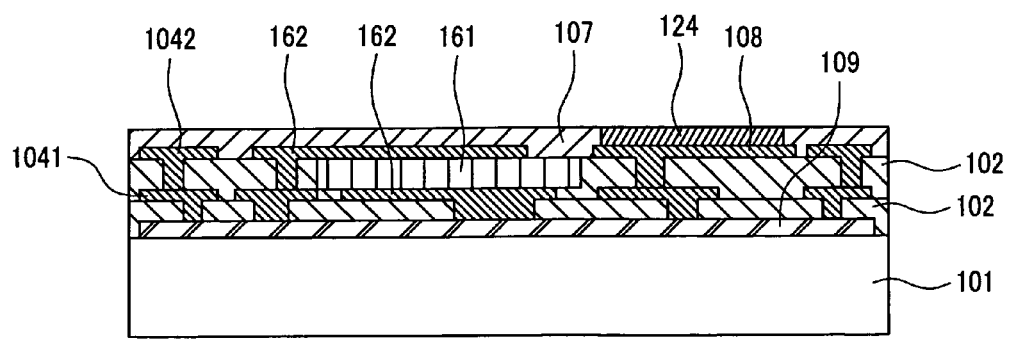
FIG. 25 is a cross-sectional view of a tag having a button-shaped cell and a wiring structure for connection between both electrodes of the cell and a circuit of a semiconductor chip according to a ninth embodiment of the present invention.

A ninth embodiment relates to a tag having a button-shaped cell as a power supply and a wiring structure for connection between both electrodes of the cell and the circuit of the semiconductor chip 100. FIG. 25 is a configuration diagram thereof.

The semiconductor chip 100, when connected to both electrodes of a button-shaped cell 161, executes pre-programmed operations without being supplied with an external power. With an external environment detecting sensor incorporated in the semiconductor chip 100 described in the first embodiment and with the structure of this embodiment, for example, a thermal career and a humidity career obtained by a temperature sensor and a humidity sensor are stored in a memory. These stored data are replied from the coil antenna in accordance with a read signal provided from the transformer 206 in the reader/writer. 201. Various constituent portions of the semiconductor chip shown in FIG. 25 and equivalent to those in the previous embodiments are identified by the same reference numerals as in the previous embodiments.

According to the tag of this embodiment, the semiconductor chip functions as a sensor also when not supplied with electric power from the reader/writer and the stored data can be transmitted efficiently to the reader/writer 201. Although in this embodiment reference has been made to a cell as an example of a power supply means, the tag may be provided with a wired power supply means.

Reference Numerals will be briefly explained as below.

10 . . . laser, 11 . . . laser light axis, 12 . . . vertical plane of laser axis, 13 . . . metal film mask, 16 . . . taper angle, 23 . . . sputtered film, 24 . . . unsputtered part, 25 . . . sputtered film and plating film, 26 . . . unplating part, 50 . . . coil length, 51 . . . a loop with a relative permeability μr and a loop area Stag, 52 . . . voltmeter indicating an electromotive force Vtag, 53 . . . alternate source of current Irw, 54 . . . transformer, 55 . . . coil antenna having n turns, 99 . . . sensor-free semiconductor chip, 100 . . . semiconductor chip provided with a sensor, 101 . . . silicon wafer, 102 . . . polyimide, 104 . . . coil antenna, 1041 . . . first layer of coil antenna, 1042 . . . second layer of coil antenna, 1043 . . . third layer of coil antenna, 1044 . . . fourth layer of coil antenna, 105 . . . through hole, 106 . . . resist, 107 . . . protecting polyimide, 108 . . . sensor electrode section, 109 . . . integrated circuit surface of a semiconductor chip, 110 . . . metallic plate, 111 . . . copper-plated layer, 121 . . . reference electrode, 122 . . . ion sensitive FET, 123 . . . organic film, 124 . . . external environment measuring sensor, 130 . . . magnetic material, 131 . . . magnetic material-dispersed resin, 132 . . . external form of a semiconductor chip circuit surface, 133 . . . internal form of coil antenna, 140 . . . silicon dioxide film on the back side of chip, 141 . . . silicon dioxide film in the interior of SOI substrate, 151 . . . electric path, 152 . . . mirror image of the electric path, 161 . . . button-shaped cell, 162 . . . power supply wiring, 200 . . . measuring device, 201 . . . external device (reader/writer), 202 . . . transformer, 203 . . . alternate magnetic field (magnetic field lines), 204 . . . magnetic field lines based on mirror image, 205 . . . strengthening direction of resultant magnetic field lines, 206 . . . transformer, 207 . . . coil antenna, 208 . . . RF section, 209 . . . control section, 210 . . . sensor section, 300 . . . inspection vessel, 301 . . . solution to be inspected.

What is claimed is:

1. A semiconductor chip comprising:
   a coil antenna;
   a circuit for transmission and reception of signals to and from an external device with use of said coil antenna;
   a mechanism for increasing a coupling coefficient in an electromagnetic coupling between said coil antenna and said external device; and
   wherein in connection with said mechanism, a circuit surface of said semiconductor chip and said coil antenna are arranged in such a manner that magnetic field lines passing through the coil antenna are strengthened by a mirror effect of the coil antenna induced by the circuit surface of said semiconductor chip, in which an external form of the circuit surface of said semiconductor chip is formed inside an external form of said coil antenna and said coil antenna is formed outside, or in an area mainly outside, an external form of the circuit surface of said semiconductor chip, in a plan view of the circuit surface of the chip.

2. A semiconductor chip according to claim 1, wherein said mechanism comprises plural layers of said coil antenna.

3. A semiconductor chip according to claim 2, wherein said plural layers of said coil antenna are arranged in such a manner that parallel components in an odd-numbered layer of coil wiring and in an even-numbered layer of coil wiring in said coil antenna overlap each other as viewed from an upper surface side of said coil antenna.

4. A semiconductor chip according to claim 2, wherein coil wiring widths of most adjacent layers in said coil antenna having the plural layers are different from each other.

5. A semiconductor chip according to claim 1, wherein a width of the circuit surface of said semiconductor chip is larger than an innermost periphery diameter of said coil antenna.

6. A communication system comprising:
   the semiconductor chip recited in claim 1: and
   an external device adapted to transmit and receive signals by radio to and from the semiconductor chip.

* * * * *